(12) United States Patent
Ishihara et al.

(10) Patent No.: US 7,796,416 B2
(45) Date of Patent: Sep. 14, 2010

(54) VARIABLE RESISTANCE ELEMENT, ITS MANUFACTURING METHOD AND SEMICONDUCTOR MEMORY DEVICE COMPRISING THE SAME

(75) Inventors: Kazuya Ishihara, Kurashiki (JP); Yasunari Hosoi, Fukuyama (JP); Shinji Kobayashi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 160 days.

(21) Appl. No.: 12/092,766

(22) PCT Filed: Dec. 13, 2006

(86) PCT No.: PCT/JP2006/324802

§ 371 (c)(1),
(2), (4) Date: May 6, 2008

(87) PCT Pub. No.: WO2007/074642

PCT Pub. Date: Jul. 5, 2007

(65) Prior Publication Data

US 2009/0097300 A1    Apr. 16, 2009

(30) Foreign Application Priority Data

Dec. 27, 2005  (JP)  ............................. 2005-375852

(51) Int. Cl.
*G11C 11/00*    (2006.01)
(52) U.S. Cl. .................... 365/148; 365/100; 365/46
(58) Field of Classification Search ............... 365/148, 365/100, 46
See application file for complete search history.

(56) References Cited

U.S. PATENT DOCUMENTS

| 6,204,139 | B1 | 3/2001 | Liu et al. |
| 6,815,744 | B1 | 11/2004 | Beck et al. |

(Continued)

FOREIGN PATENT DOCUMENTS

JP    2002-537627    11/2002

(Continued)

OTHER PUBLICATIONS

International Search Report for PCT/JP2006/324802 mailed Mar. 13, 2007.

(Continued)

*Primary Examiner*—Thong Q Le
(74) *Attorney, Agent, or Firm*—Nixon & Vanderhye P.C.

(57) ABSTRACT

Provided is a variable resistance element capable of performing a stable resistance switching operation and having a favorable resistance value retention characteristics, comprising a variable resistor 2 sandwiched between a upper electrode 1 and lower electrode 3 and formed of titanium oxide or titanium oxynitride having a crystal grain diameter of 30 nm or less. When the variable resistance 2 is formed under the substrate temperature of 150° C. to 500° C., an anatase-type crystal having a crystal grain diameter of 30 nm or less is formed. Since the crystalline state of the variable resistor changes by applying a voltage pulse and the resistance value changes, no forming process is required. Moreover, it is possible to perform a stable resistance switching operation and obtain an excellent effect that the resistance fluctuation is small even if the switching is repeated, or the variable resistance element is stored for a long time under a high temperature.

17 Claims, 22 Drawing Sheets

U.S. PATENT DOCUMENTS

2004/0245557 A1 12/2004 Seo et al.
2005/0002227 A1* 1/2005 Hideki et al. ............... 365/163
2005/0117397 A1* 6/2005 Morimoto .............. 365/185.21

FOREIGN PATENT DOCUMENTS

JP            2004-363604          12/2004

OTHER PUBLICATIONS

Fujimoto et al., High Speed Resistive Switching of $TiO_2$/TiN Nano-Crystalline Thin Film, *Japanese Journal of Applied Physics*, vol. 45, No. 11, Mar. 2006, pp, L310-L312.

Kinoshita et al., New Model Proposed for Switching Mechanism of ReRAM, *Proc. IEEE Non-Volatile Semiconductor Memory Workshop*, Dec. 2006, pp. 84-85.

Kinoshita et al., "Bias polarity dependent data retention of resistive random access memory consisting of binary transition metal oxide", *Applied Physics Letter*, vol. 89, Jun. 2006, 103509.

Liu et al, "Electric-Pulse-Induced Reversible Resistance Change Effect in Magnetoresistive Films", Applied Physics Letter, vol. 76, 2000, pp. 2749-2751.

Pagnia et al, "Bistable Switching in Electroformed Metal-Insulator-Metal Devices", Phys. Stat. So. (a), vol. 108, 1988, pp. 11-65.

Taylor et al, "RF Relaxation Oscillations in Polycrystalline TiO2 Thin Films", Solid-State Electronics, vol. 19, 1976, pp. 669-674.

Argall et al, "Switching Phenomena in Titanium Oxide Thin Films", Solid-State Electronics, Perfgamon Press 1968, vol. 11, pp. 535-541.

Beam et al, "Further Properties and a Suggested Model for Niobium Oxide Negative Resistance", Proceedings of the IEEE, 52, pp. 300-301, 1964.

Seo et al, "Conductivity Switching Characteristics and Reset Currents in NiO Films", Applied Physics Letters 86, 093509 (2005).

International Search Report of PCT/JP2006/314487 mailed Oct. 3, 2006 (2 pages).

Baek, I.G. et al.: "Highly Scalable Non-volatile Resistive Memory using Simple Binary Oxide Driven by Asymmetric Unipolar Voltage Pulses," IEEE Technical Digest of 2004 International Electron Devices Meeting, pp. 587-590, Dec. 2004.

Office Action mailed Jun. 22, 2010 in co-pending U.S. Appl. No. 11/997,184 (7 pages).

* cited by examiner

VARIABLE RESISTANCE ELEMENT, ITS MANUFACTURING METHOD AND SEMICONDUCTOR MEMORY DEVICE COMPRISING THE SAME

CROSS-REFERENCE TO RELATED APPLICATIONS

This application is a National Phase filing under 35 U.S.C. §371 of International Application No. PCT/JP2006/324802 filed on Dec. 13, 2006, and which claims priority to Japanese Patent Application No. 2005-375852 filed on Dec. 27, 2005.

TECHNICAL FIELD

An aspect of the present invention relates to a variable resistance element comprising a first electrode and a second electrode and a variable resistor in which the variable resistor is sandwiched between the first electrode and the second electrode and its electric resistance is changed when a voltage pulse is applied between both electrodes, and its manufacturing method. Another aspect of the present invention relates to a semiconductor memory device comprising the above variable resistance element.

BACKGROUND ART

Recently, as a next generation high-speed nonvolatile random access memory (NVRAM) to replace a flash memory, various kinds of device structures such as a FeRAM (Ferroelectric RAM), a MRAM (Magnetic RAM), a PRAM (Phase Change RAM) are proposed and there are severe development races among them, seeking for high performance, high reliability, low cost and process consistency. However, the above memory devices at the present have both merits and demerits and an ideal "universal memory" having all merits of a SRAM, a DRAM, and a flash memory is far from practical use.

A nonvolatile RRAM (Resistive Random Access Memory) using a variable resistance element whose electric resistance is reversibly changed by applying a voltage pulse has been proposed based on the existing technique. This constitution is shown in FIG. 1.

As shown in FIG. 1, a conventional variable resistance element comprises a lower electrode 3, a variable resistor 2 and an upper electrode 1 laminated sequentially in which its resistance value can be reversibly changed when a voltage pulse is applied between the upper electrode 1 and the lower electrode 3. A new nonvolatile semiconductor memory device can be implemented by reading the resistance value changed by the reversible resistance changing operation (referred to as "switching operation" hereinafter).

The nonvolatile semiconductor memory device comprises a memory cell array having a plurality of memory cells each having a variable resistance element and disposed in a row direction and column direction like a matrix, and peripheral circuits for controlling programming, erasing and reading actions of data for each memory cell of the memory cell array. Thus, this memory cell includes memory cells having different components, such as a memory cell having one selection transistor T and one variable resistance element R (called "1T/1R type") and a memory cell having only one variable resistance element R (called "1R type").

Meanwhile, regarding a material constituting the variable resistor 2, a method for changing an electric resistance reversibly by applying a voltage pulse to a perovskite material known for having a colossal magnetoresistance effect is disclosed by Shangquing Liu, Alex Ignatiev et al., in University of Houston, U.S.A. in the following patent document 1 and a non-patent document 1. This is an extremely epoch-making method because even when the perovskite material known for having the colossal magnetoresistance effect is used, a resistance change ranging over several digits can be seen at room temperature without applying a magnetic field. In addition, according to an element structure shown in the patent document 1, the variable resistor is formed of a perovskite-type oxide such as a crystalline praseodymium calcium manganese oxide $Pr_{1-x}Ca_xMnO_3$(PCMO) film.

In addition, it is known from a non-patent document 2 and a patent document 2 that regarding the material of the variable resistor 2, a titanium oxide ($TiO_2$) film, a nickel oxide (NiO) film, a zinc oxide (ZnO) film, and a niobium oxide ($Nb_2O_5$) film formed of a transition metal oxide also show reversible resistance change. Especially, titanium oxide and nickel oxide is considered to be a material in which the resistance is changed when a region in which resistivity is locally lowered in the oxide (referred to as "filament path" occasionally hereinafter) is formed and the filament path is broken due to heat increase caused by a current flowing in the variable resistance element.

Furthermore, it is known from the non-patent document 2 and the patent document 2 that regarding the material of the variable resistor 2, the titanium oxide ($TiO_2$) film, the nickel oxide (NiO) film, the zinc oxide (ZnO) film, and the niobium oxide ($Nb_2O_5$) film formed of the transition metal oxide also show reversible resistance change. Among the above materials, the phenomena of switching operations with titanium oxide and nickel oxide are reported in detail in non-patent documents 3 to 6 and a non-patent document 7, respectively.

Patent document 1: U.S. Pat. No. 6,204,139

Non-patent document 1: Liu, S. Q. et al., "Electric-pulse-induced reversible Resistance change effect in magnetoresistive films", Applied Physics Letter, Vol. 76, pp. 2749-2751, in 2000

Non-patent document 2: H. Pagnia et al., "Bistable Switching in Electroformed Metal-Insulator-Metal Devices", Phys. Stat. Sol. (a), vol. 108, pp. 11-65, in 1988

Patent document 2: Japanese Unexamined Publication of PCT Application No. 2002-537627

Non-patent document 3: G. Taylor et al., "RF Relaxation Oscillations in Polycrystalline TiO2 Thin Films", Solid-State Electronics, 1976, vol. 19, pp. 669-674

Non-patent document 4: F. Argall et al., "Switching Phenomena in Titanium Oxide Thin Films", Solid-State Electronics, Pergamon Press 1968, vol. 11, pp. 535-541

Non-patent document 5: Beam et al., Proc. IEEE, 52, 300-1, 1964

Non-patent document 6: F. Argall, Solid State Electronicis Pergamon Press 1968, vol. 11, pp. 535

Non-patent document 7: S. Seo et al., Applied Physics Letters 86, 093509, 2005

When the perovskite-type oxide is used as the material of the variable resistor 2 whose resistance is changed in response to the voltage pulse, since its crystallization temperature is as high as 500° C. to 700° C., it cannot be formed after the wiring of an LSI is formed. In addition, most constituent elements of perovskite are not used in a LSI process and since these constituent elements could affect device characteristics, it is necessary to examine and take measures against contamination of these elements.

Meanwhile, when the variable resistor 2 is formed of titanium oxide or nickel oxide, since titanium and nickel is largely used in the LSI process, they do not affect the device characteristics. However, the resistance change of the variable resistance element formed of titanium oxide and nickel oxide conventionally considered is based on a phenomenon in which low resistance and high resistance are provided when a filament path is formed and broken depending on a voltage pulse applying condition. Thus, in order to provide the switching operation, it is necessary to form the filament path by applying a specific voltage first (referred to as "forming process" hereinafter).

In addition, according to the above element, the problems are that the diameter of the filament path is increased as the number of switching operations is increased, that the resistance value fluctuates due to the change of filament density, and that it is difficult to control the resistance value because there is no area dependency in the element in a low resistance state since the resistance value is determined by a filament, so that it is not practically used as a device at the present.

The present invention was made in view of the above problems and it is an object of the present invention to provide a variable resistance element superior in LSI process consistency, capable of performing a resistance switching operation without a filament path, and showing a stable resistance value retention characteristics.

SUMMARY OF THE INVENTION

A variable resistance element according to an embodiment of the present invention to attain the above object comprises a first electrode, a second electrode and a variable resistor sandwiched between the first electrode and the second electrode, in which an electric resistance between the first electrode and the second electrode is changed by applying a voltage pulse between the first electrode and the second electrode, and it is characterized as a first characteristics in that the variable resistor is formed of titanium oxide or titanium oxynitride having a crystal grain diameter of 30 nm or less.

In addition, the variable resistance element according to the present invention embodiment is characterized as second characteristics in addition to the first characteristics in that the crystal structure of the variable resistor is anatase type.

In addition, the variable resistance element according to the present invention embodiment is characterized as third characteristics in addition to the first or second characteristics in that the 101 face of the crystal of the variable resistor is changed by applying a voltage pulse between the first electrode and the second electrode.

In addition, the variable resistance element according to the present invention embodiment is characterized as fourth characteristics in addition to the third characteristics in that the resistance value of the variable resistor is increased when the 101 face increases, and the resistance value is decreased when the 101 face decreases or disappears.

In addition, the variable resistance element according to the present invention embodiment is characterized as fifth characteristics in addition to any one of the first to fourth characteristics in that at least one of the first electrode and the second electrode contains an element selected from Pt, Ir, Os, Ru, Rh, Pd, Ti, Co, W, and an alloy of Ti and W, or contains titanium nitride.

A manufacturing example method of the variable resistance element having the first characteristics according to the present invention is characterized as first characteristics by comprising a first step for forming the second electrode, a second step for forming the variable resistor by depositing a titanium oxide film or a titanium oxynitride film having a crystal grain diameter of 30 nm or less on the upper surface of the second electrode, and a third step for forming the first electrode on the upper surface of the variable resistor.

In addition, the example manufacturing method of the variable resistance element according to the present invention is characterized as second characteristics in addition to the first characteristics in that the second step comprises a step of forming the titanium oxide film under a substrate temperature of 150° C. to 500° C.

In addition, the example manufacturing method of the variable resistance element according to the present invention is characterized as third characteristics in addition to the first characteristics in that the second step comprises a step of performing a heat treatment on the titanium oxide film at 250° C. to 500° C. under an oxygen atmosphere or an atmosphere containing oxygen after the titanium oxide film is deposited.

In addition, the example manufacturing method of the variable resistance element according to the present invention is characterized as fourth characteristics in addition to the first characteristics in that the first step comprises a step of forming a titanium nitride as the second electrode, and the second step comprises a step of forming the titanium oxide film or the titanium oxynitride film on the surface of the second electrode by performing a heat treatment on the surface of the second electrode at 250° C. to 500° C. under an oxygen atmosphere or an atmosphere containing oxygen.

A semiconductor memory device embodiment according to the present invention comprises a memory cell array in which a plurality of memory cells each having the variable resistance element having any one of the above first to fifth characteristics are arranged, a selecting means for selecting a specific target memory cell from the plurality of memory cells constituting the memory cell array, and a pulse voltage generating means for generating a pulse voltage, and it is characterized in that information is written by the change of the resistance value of the variable resistance element when the pulse voltage generated from the pulse voltage generating means is applied to the variable resistance element of the target memory cell selected by the selecting means.

When the variable resistor is formed of titanium oxide or titanium oxynitride having the crystal grain diameter of 30 nm or less, the variable resistance element can implement the stable switching operation and favorable data retention characteristics.

Especially, according to the above constitution, since the crystal state of the variable resistor is changed and as a result, the resistance value is changed in response to the application of the voltage pulse, the forming process is not needed and the stable resistance switching operation can be provided. In addition, since the resistance switching operation is not performed by the filament path, the resistance fluctuation is small even after the switching is repeated, and the resistance fluctuation is small even after held over a long period at high temperature. Therefore, the element of the present invention is advantageously applied to a nonvolatile memory.

In addition, according to the constitution of the present invention, since the resistance switching operation is not performed by the filament path as described above, area dependency is provided by miniaturizing the resistance element.

Furthermore, since the variable resistance element embodiment of the present invention is formed of titanium oxide or titanium oxynitride as the variable resistor, when the lower electrode is formed of titanium or titanium nitride, the titanium oxide film or the titanium oxynitride film can be formed by oxidizing the surface of the lower electrode. That is, according to this example manufacturing method, since the variable resistor film can be formed by the general step in the semiconductor process, that is, the heat treatment, a special device for forming the film is not needed. Furthermore, since the heat treatment is performed at a low temperature of 500° C. or less, the treatment can be performed after the wiring process.

In addition, according to the semiconductor memory device embodiment comprising the variable resistance element of the present invention, the stable switching operation having a large resistance ratio and favorable data retention characteristics are implemented, it can be applied to a memory card and a recording medium of an electronic device such as a mobile phone, a mobile game, a digital camera, and a printer and the like.

EXPLANATION OF REFERENCES

Figure 1:
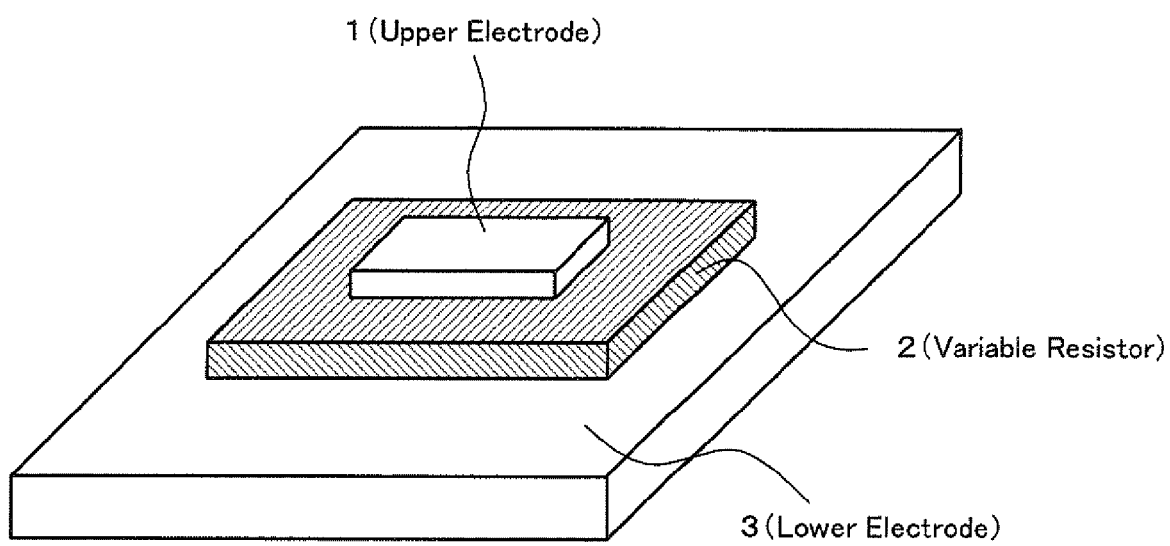
FIG. 1 is a schematic view showing the structure of a variable resistance element.

1: Upper Electrode
2: Variable Resistor
3: Lower Electrode
4: Interlayer Insulation Film
5: Conductive Film
10: Variable Resistance Element
11: Contact Hole
12: Contact Hole
20: Measurement Device
21: Pulse Generator
22: Digital Oscilloscope
23: Parameter Analyzer
24: Switch
21a, 21b: Terminal
22a, 22b, 22g: Terminal
23a: Terminal
24a, 24b, 24c: Terminal
30: Semiconductor Memory Device
31: Memory Cell Array
32: Control Circuit
33: Read Circuit
34: Bit Line Decoder
35: Word Line Decoder
36: Voltage Pulse Generation Circuit
40: Semiconductor Substrate
41: Element Isolation Area
42: Gate Insulation Film
43: Gate Electrode
44: Drain Diffusion Layer Area
45: Source Diffusion Layer Area
46: Interlayer Insulation Film
47: Contact Hole
48: Ohmic Contact Layer
49: Lower Electrode
50: Variable Resistor
51: Upper Electrode
52: Interlayer Insulation Film
53: Contact Hole
54: Contact Hole
55: Wiring
56: Wiring
57: Interlayer Insulation Film
58: Wiring
59: Surface Protection Film
R: Variable Resistance Element T: Selection Transistor
W1, W2, . . . , Wn: Word Line
B1, B2, . . . , Bm: Bit Line
S: Source Line

DETAILED DESCRIPTION OF THE INVENTION

Embodiments of a variable resistance element and its manufacturing method according to the present invention (occasionally hereinafter referred to as "element of the present invention" and "method of the present invention", respectively) will be described with reference to the drawings hereinafter. Then, a semiconductor memory device comprising the element of the present invention (referred to as "device of the present invention" occasionally hereinafter) will be described.

The element of the present invention has a constitution in which an upper electrode and an lower electrode are connected through a variable resistor, and especially when the variable resistor is formed of titanium oxide or titanium oxynitride whose crystal has a grain diameter of a predetermined value (30 nm as will be described below) or less, it is found that a switching operation in which resistance is changed in response to the application of a voltage pulse can be performed stably. Hereinafter, the manufacturing process of the element of the present invention will be described and then, the effect of the element of the present invention will be described based on verification data.

In addition, the term "grain diameter" in this specification is an average value of a long side and a short side of a circumscribed rectangular solid of a crystal observed by a super-high-resolution transmission electron microscope (referred to as "TEM" hereinafter).

FIRST EMBODIMENT

A first embodiment (referred to as "this embodiment" occasionally hereinafter) of the element of the present invention and its manufacturing method will be described with reference to FIGS. 1 to 19. In addition, the element of the present invention is characterized by a material used for a variable resistor serving as one component and its overall constitution is the same of the variable resistance element having the conventional constitution described in the section of the background art as shown in FIG. 1.

According to the element of the present invention in this embodiment, a variable resistor 2 contained in the variable resistance element shown in FIG. 1 is formed of titanium oxide having a grain diameter of 30 nm or less as will be described below.

Figure 2:
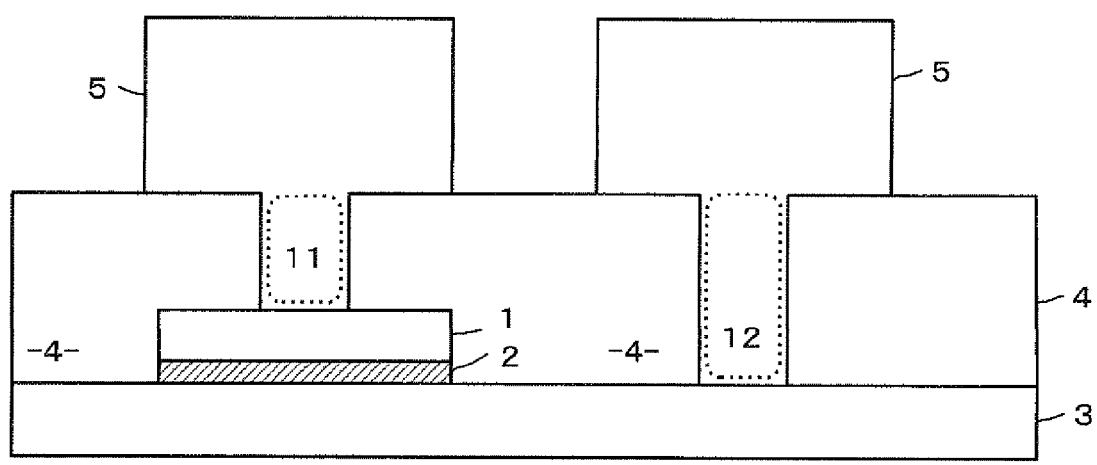
FIG. 2 is a schematic sectional view showing a structure in one step of an example manufacturing process of a variable resistance element according to the present invention.

FIG. 2 is a schematic section view showing the element of the present invention in this embodiment. An element 10 of the present invention comprises a lower electrode 3, the variable resistor 2, an upper electrode 1 laminated on a substrate in this order in the vertical direction. Thus, interlayer insulation films 4 are formed thereon, and contact holes 11 and 12 for applying a pulse voltage between the lower electrode 3 and the upper electrode 1 are provided, and a conductive film 5 is laminated so as to be connected to the lower electrode 3 or the upper electrode 1 through the contact hole. The manufacturing process of the element 10 of the present invention will be described with reference to FIGS. 2 to 10 hereinafter. In addition, each of FIGS. 2 to 9 is a schematic sectional view in one step when the element 10 of the present invention is manufactured. In addition, FIG. 10 is a flowchart showing the manufacturing process of the element 10 of the present invention and each step in the following description corresponds to one step in the flowchart shown in FIG. 10.

In addition, since the schematic sectional views shown in FIGS. 2 to 9 are schematically shown only, it is to be noted that the contraction scale of the dimension of the actual structure does not always correspond to the contraction scale of the drawing.

Figure 3:
FIG. 3 is a schematic sectional view showing a structure in one step of the example manufacturing process of the variable resistance element according to the present invention.

First, as shown in FIG. 3, the lower electrode 3 is deposited on a base substrate (not shown) by the sputtering method (step S1). The lower electrode 3 is formed by depositing a titanium nitride (TiN) film (the lower electrode 3 is referred to as "TiN film 3" occasionally in this embodiment hereinafter) serving as a conductive material and having a thickness of 200 nm, for example.

Figure 4:
FIG. 4 is a schematic sectional view showing a structure in one step of the example manufacturing process of the variable resistance element according to the present invention.

Then, as shown in FIG. 4, the variable resistor material film 2 formed of titanium oxide is formed on the surface of the TiN film 3 by the DC magnetron sputtering method (step S2). A metal Ti target is used as a sputtering target and Ar having a flow rate of 5 sccm and $O_2$ having a flow rate of 15 sccm are introduced as process gas, and a DC voltage of 1.5 kW/cm$^2$ is applied to the target under a pressure of 3 to 15 mTorr. A substrate temperature at this time is set at 150° C. to 500° C. The inside is a plasma state by the voltage application and an accelerated Ar$^+$ ion in the plasma collides against the target and a Ti atom that is a target material is sputtered by collision energy and attached on the substrate. At this time, it reacts with the introduced $O_2$ gas and a titanium oxide film (the variable resistor 2 is referred to as "titanium oxide film 2" occasionally in this embodiment hereinafter) is formed on the substrate. The titanium oxide film 2 has a thickness of 5 to 50 nm.

The titanium oxide film 2 formed as described above comprises anatase-type titanium oxide having a crystal grain diameter of 30 nm or less as will be described below. Meanwhile, in the case where the substrate temperature is as low as 150° C. or less, an amorphous-type titanium oxide film is formed on the TiN film 3. In this case, after it is formed, it is heat-treated at 250° C. to 500° C. under an oxygen-nitrogen mixed gas atmosphere having an oxygen concentration of 5% to 100% or under an oxygen-argon mixed gas atmosphere having an oxygen concentration of 5% to 100% with an electric furnace or a lamp heating device. Thus, the anatase-type titanium oxide film can be formed.

In addition, the method for forming the titanium oxide film 2 is not limited to the DC magnetron sputtering method and it may be formed by a CVD method. In the case where it is formed by the CVD method, the substrate is heated to 250° C. to 500° C. and as a raw material, TiCl$_4$ or organic metal such as Ti(OCH$_3$)$_4$, Ti(OC$_2$H$_6$)$_4$, Ti(O-i-C$_3$H$_7$)$_4$, Ti(O-n-C$_4$H$_7$)$_4$, Ti(O-n-C$_4$H$_9$)$_4$, or Ti(O-sec-C$_4$H$_9$)$_4$ is introduced into a reaction chamber by a carburetor to react with oxygen. In the case where the film is formed by the CVD method also, since the titanium oxide film formed at the low substrate temperature (250° C. or less) shows the amorphous type, similar to the DC magnetron sputtering method described above, the anatase-type titanium oxide film is to be formed by the heat treatment at 250° C. to 500° C. under an oxygen atmosphere after the titanium oxide has been formed.

Figure 5:
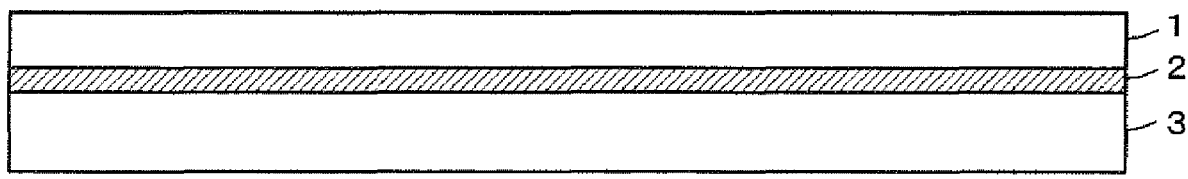
FIG. 5 is a schematic sectional view showing a structure in one step of the example manufacturing process of the variable resistance element according to the present invention.

Next, as shown in FIG. 5, the upper electrode 1 is deposited on the titanium oxide film 2 by the sputtering method (step S3). The upper electrode 1 is formed by depositing a Pt film (the upper electrode 1 is referred to as "Pt film 1" occasionally in this embodiment hereinafter) formed of a metal material and having a thickness of 100 nm, for example.

Figure 6:
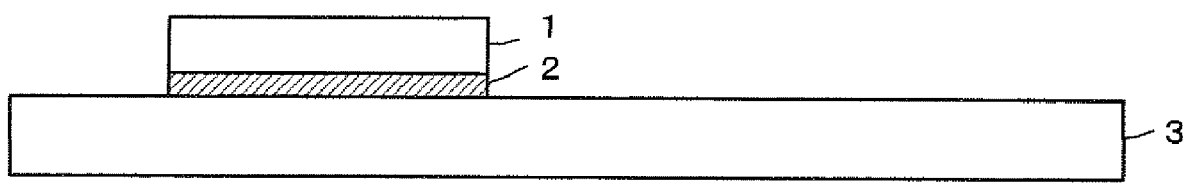
FIG. 6 is a schematic sectional view showing a structure in one step of the example manufacturing process of the variable resistance element according to the present invention.

Then, as shown in FIG. 6, the Pt film 1 and the titanium oxide film 2 are sequentially processed by dry etching using a resist patterned by the well-known photolithography method as a mask (step S4). Similarly, the TiN film 3 is processed using a resist patterned by the photolithography method as a mask (a processing pattern is not shown).

Figure 7:
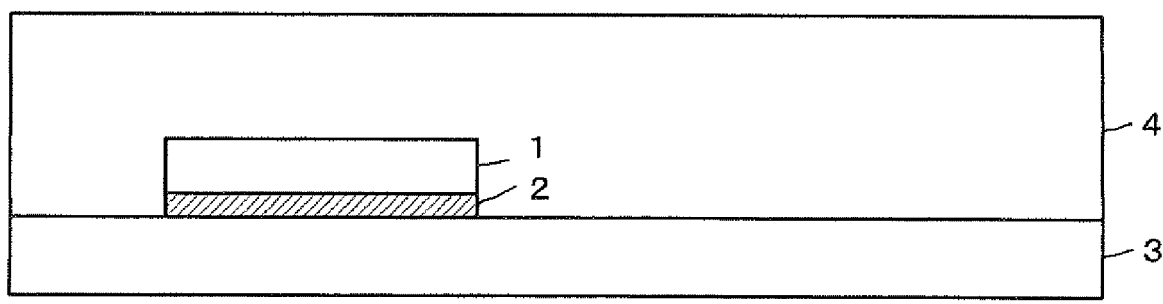
FIG. 7 is a schematic sectional view showing a structure in one step of the example manufacturing process of the variable resistance element according to the present invention.
Figure 8:
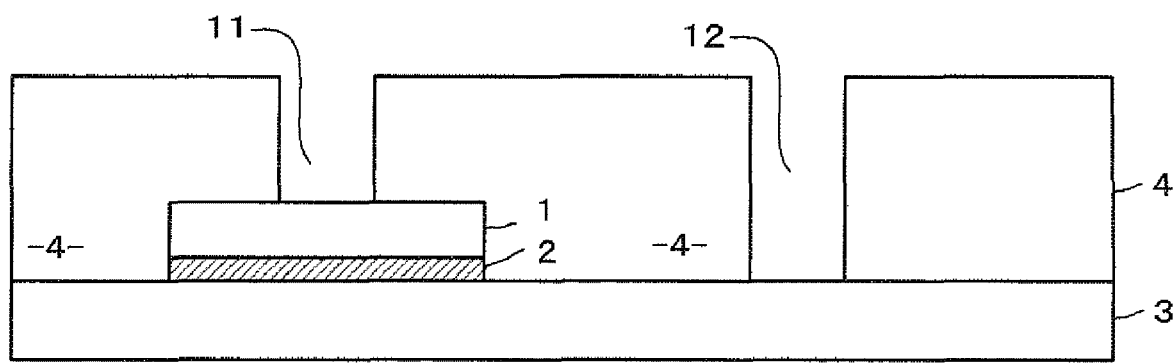
FIG. 8 is a schematic sectional view showing a structure in one step of the example manufacturing process of the variable resistance element according to the present invention.

Then, as shown in FIG. 7, the interlayer insulation film 4 is deposited on the Pt film 1 and the TiN film 3 (step S5). For example, the interlayer insulation film 4 is formed by depositing a silicon oxide film having a thickness of 500 nm such that TEOS (tetraethoxysilane) as a raw material is mixed with ozone and oxygen to be chemically vapor-deposited by an atmospheric pressure thermal CVD method. Thus, as shown in FIG. 8, the interlayer insulation film 4 is processed by etching using a resist patterned by the photolithography method as a mask, whereby the contact hole 11 reaching the upper electrode 1 and the contact hole 12 reaching the lower electrode 3 are formed (step S6).

Figure 9:
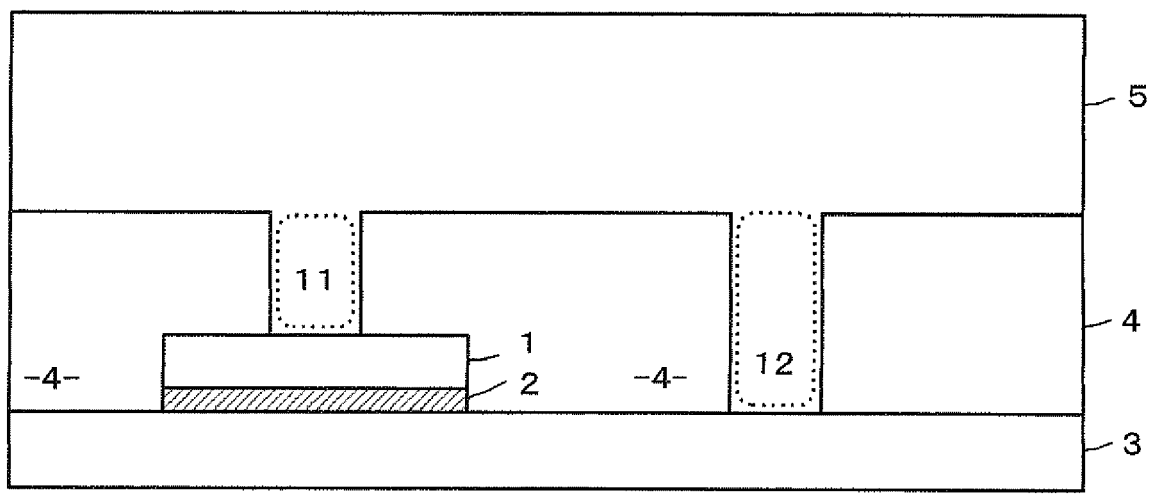
FIG. 9 is a schematic sectional view showing a structure in one step of the example manufacturing process of the variable resistance element according to the present invention.
Figure 10:
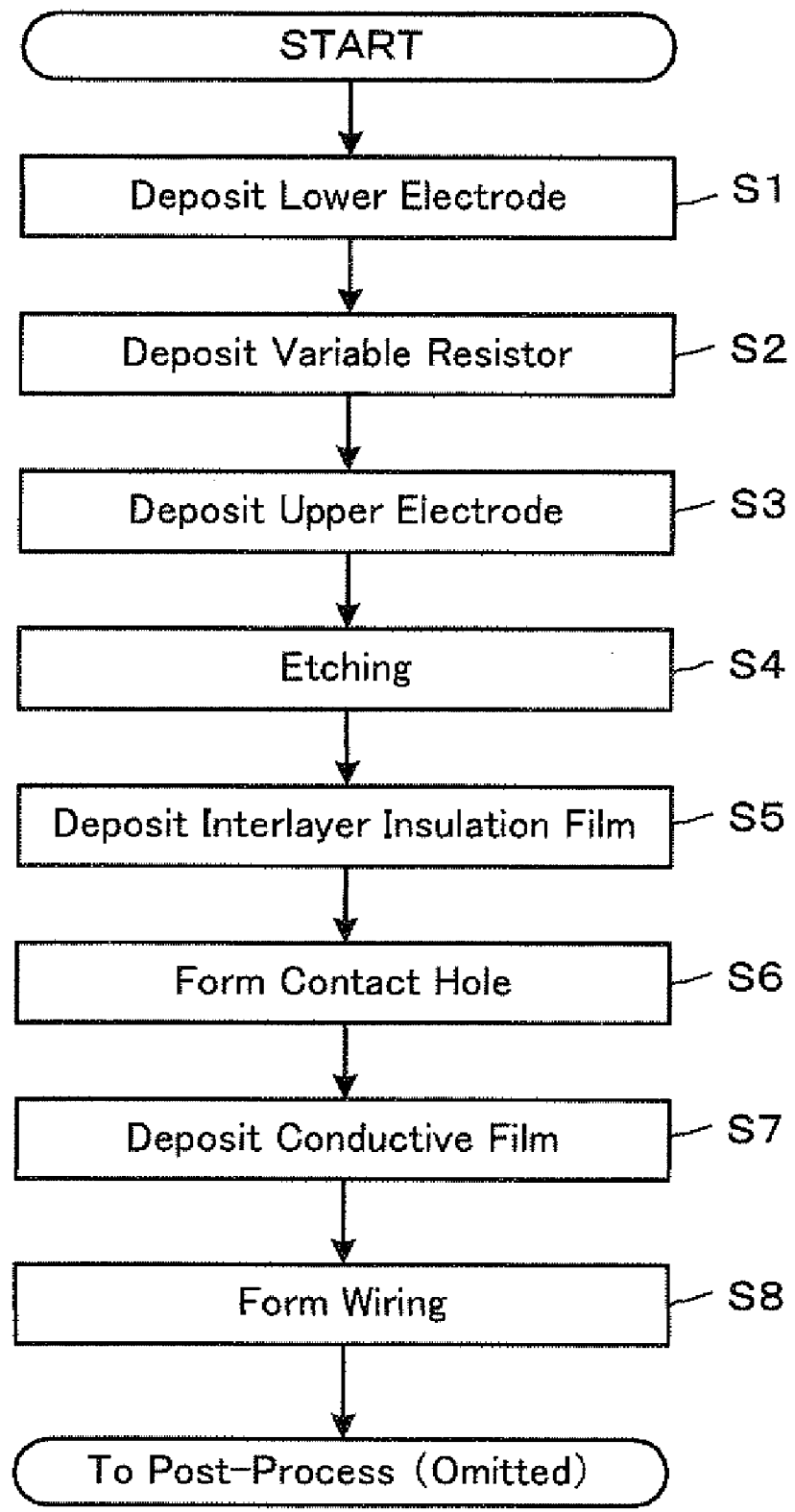
FIG. 10 is a flowchart showing the example manufacturing process of the variable resistance element according to the present invention.

Then, as shown in FIG. 9, the conductive film 5 is deposited on the upper surface including the upper electrode 1, the lower electrode 3 and the interlayer insulation film 4 to apply a voltage pulse between the upper electrode 1 and the lower electrode 3 (step S7). The conductive film 5 is formed by sequentially depositing a TiN film having a thickness of 50 nm, a Al—Si—Cu film having a thickness of 400 nm, and a TiN film having a thickness of 50 nm by the sputtering method (laminated structure of TiN/Al—Si—Cu/TiN), for example. Then, the conductive film 5 is processed by etching using a resist patterned by the photolithography method as a mask, whereby a wiring connected to the upper electrode 1 through the contact hole 11 and a wiring connected to the lower electrode 3 through the contact hole 12 are formed as shown in FIG. 2 (step S8).

In addition, in the above description, general steps such as a step for applying, exposing and developing the photoresist and a step for removing the photoresist after etching, and a cleaning step after etching and resist removing steps are omitted.

Next, a measurement device and a measuring process to evaluate the variable resistance element manufactured as described above will be described hereinafter.

Figure 11:
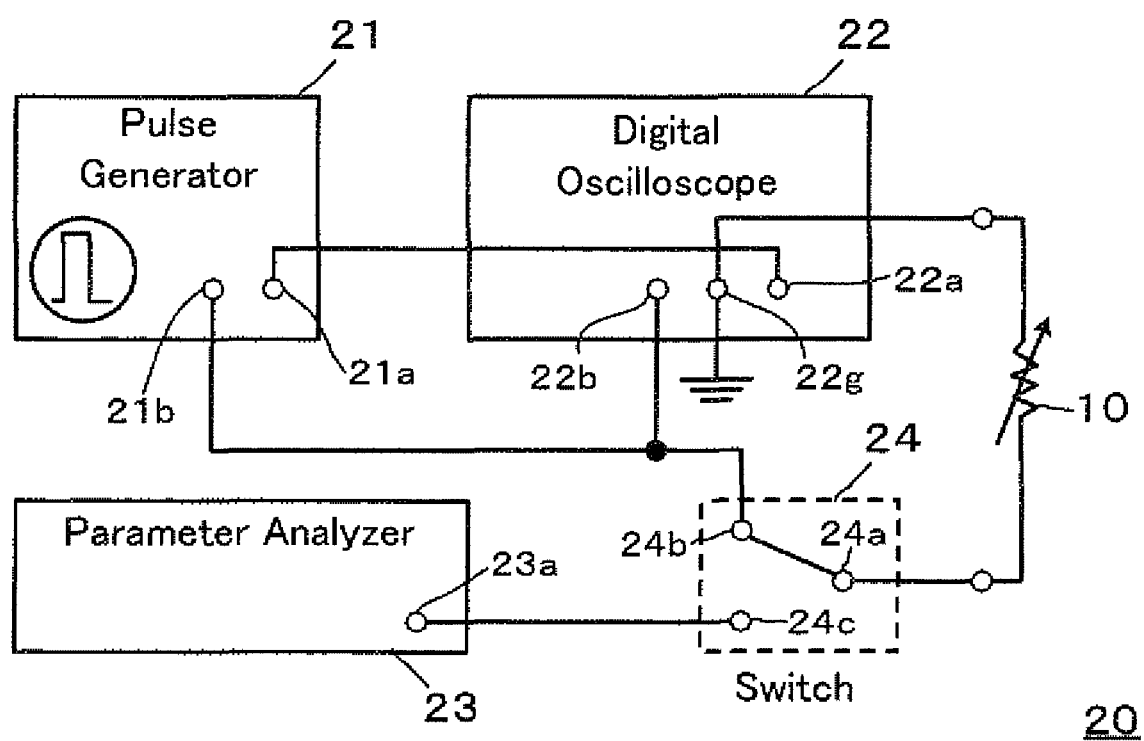
FIG. 11 is a block diagram showing the constitution of a measurement device to examine the resistance variable state of the variable resistance element embodiment according to the present invention.

FIG. 11 shows a measurement device to examine the resistance variable state of the variable resistance element. A measurement device 20 shown in FIG. 11 comprises a pulse generator 21 generating a pulse voltage, a digital oscilloscope 22 monitoring and storing a voltage waveform and the like, and a parameter analyzer 23 measuring current-voltage characteristics. In addition, a switch 24 selecting a connection destination is provided. As the parameter analyzer 23, a model number 4156B produced by Agilent Technologies is used, for example.

This measurement device has a constitution in which a voltage pulse can be applied to the variable resistance element, and the resistance value of the variable resistance element after the voltage pulse is applied can be derived from the current-voltage characteristics (referred to as "I-V characteristics" occasionally hereinafter) of the variable resistance element.

This device examines whether the variable resistance element produced by the above method can change the resistance value in response to the application of the pulse voltage or not.

One end of the variable resistance element 10 is connected to a grand terminal 22g of the digital oscilloscope 22, and the other end thereof is connected to a fixed terminal 24a of the switch 24. Furthermore, one terminal 22a of the digital oscilloscope 22 is connected to one terminal 21a of the pulse generator 21. In addition, one terminal 24b of movable terminals of the switch 24 is connected to the other terminal 22b of the digital oscilloscope 22 and to the other terminal 21b of the pulse generator 22, whereby one circuit is formed. Furthermore, the other terminal 24c of the movable terminals of the switch is connected to a terminal 23a of the parameter analyzer 22, whereby another circuit is formed. Thus, both circuits can be switched by the switching operation of the movable terminals of the switch 24.

When the voltage pulse is applied to the variable resistance element 10, the fixed terminal 24a is connected to the movable terminal 24b by the operation of the switch 24 to electrically connect the pulse generator 21 to the variable resistance element 10, whereby the voltage pulse generated from the pulse generator 21 is applied to the variable resistance element 10. Thus, the voltage pulse generated at this time is observed by the digital oscilloscope 22. Then, when the connection destination of the fixed terminal 24a is switched from the movable terminal 24b to the terminal 24c of the switch 24 to be connected to the parameter analyzer 24 (cut from the pulse generator 22), and the current-voltage characteristics of the variable resistance element 10 is measured.

First, a voltage pulse is generated from the pulse generator 21 such that a voltage of −3V (negative pulse having a voltage amplitude of 3V) having a pulse width (pulse applying time) of 100 nsec is applied to the upper electrode 1 of the variable resistance element 10 produced by the above method, and the resistance value after the voltage is applied is derived from the I-V characteristics measured by the parameter analyzer 23. After the measurement, a voltage pulse is generated from the pulse generator 21 such that a voltage of +3V (positive pulse having a voltage amplitude of 3V) having a pulse width of 200 nsec is applied to the upper electrode 1 of the variable resistance element 10, and the resistance value after the voltage is applied is derived from the I-V characteristics measured by the parameter analyzer 23.

Here, the measurement of the I-V characteristics by the parameter analyzer 23 is performed every time the voltage pulse is applied and at this time, a voltage of +0.7V is applied from the parameter analyzer 23 to the variable resistance element 1 and the I-V characteristics of the variable resistance element 11 is derived by measuring a current amount generated while the voltage is applied. While the variable resistance element 11 changes its resistance value when a voltage pulse of about ±3V is applied, it does not change its resistance value when a voltage pulse of about ±0.7V is applied. Thus, when the voltage applied from the parameter analyzer 23 for measurement is low, the resistance value can be measured without affecting the resistance value of the variable resistance element to be measured.

Figure 12:
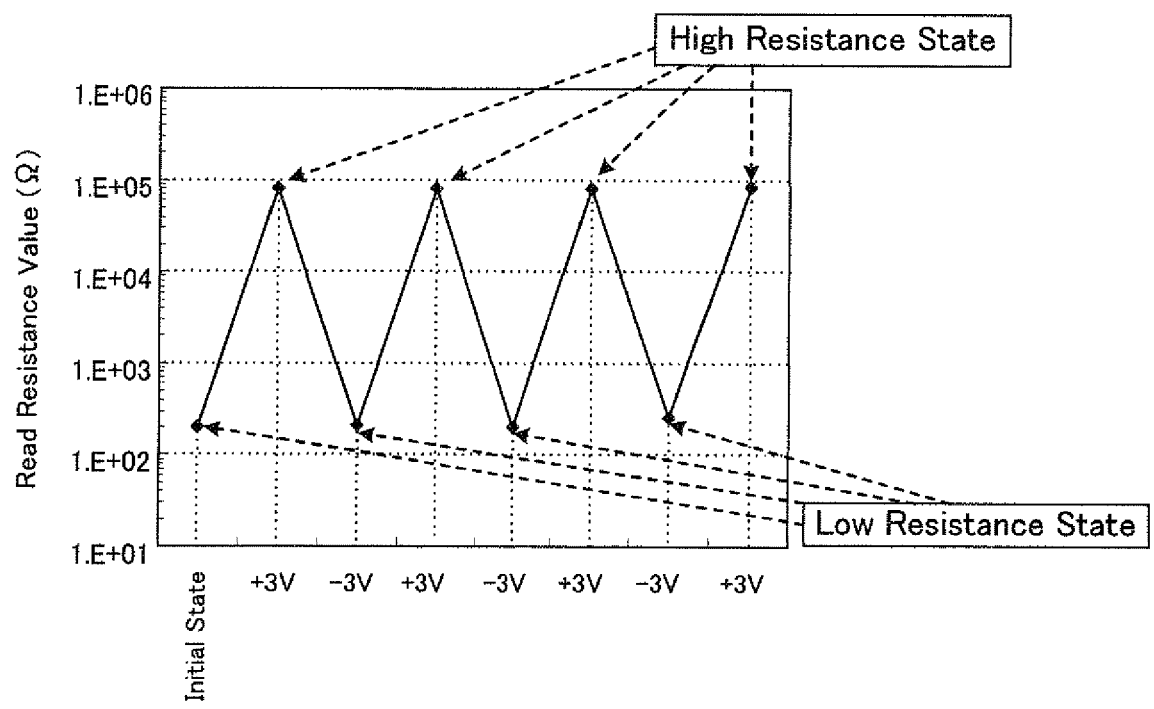
FIG. 12 is a graph showing a change of the resistance value of the variable resistance element embodiment according to the present invention in response to voltage pulse application.

FIG. 12 is a graph showing a change of the resistance value when a positive voltage (3V) having a pulse width 200 nsec and a negative voltage (−3V) having a pulse width of 100 nsec are alternately applied to the upper electrode of the variable resistance element in which the electrode area of the upper electrode 1 is 0.04 μm$^2$. The lateral axis shows the applied pulse voltage and the vertical axis shows the resistance value read by the parameter analyzer 23 in logarithmic scale. In addition, as the variable resistance element 10 to be measured, an element formed of titanium oxide showing the anatase type in which a crystal structure of the variable resistor has a grain diameter of 2 to 3 nm was used. The crystal structure will be described later.

According to the graph shown in FIG. 12, when the positive voltage pulse (3V) having the pulse width of 200 nsec is applied, the resistance value shows a high resistance value (about $8 \times 10^4 \Omega$) and then when the negative voltage pulse (−3V) having the pulse width of 100 nsec is applied, the resistance value shows a low resistance value (about $2 \times 10^2 \Omega$). Thus, it has been confirmed that when the negative pulse and the positive pulse are alternately applied, the variable resistance element 10 shows the high resistance state and the low resistance state alternately.

That is, according to FIG. 12, it is confirmed that the variable resistance element having the variable resistor comprising the titanium oxide film performs the switching operation at a resistance ratio (ratio of the resistance value at the high resistance state to the resistance value at the low resistance state) of about 400 times. In addition, the resistance state is maintained until the next voltage pulse is applied although it is not shown. Thus, it shows that the variable resistance element can be reversibly switched between binary data (high resistance state and low resistance state) as a nonvolatile memory element.

Figure 13A:
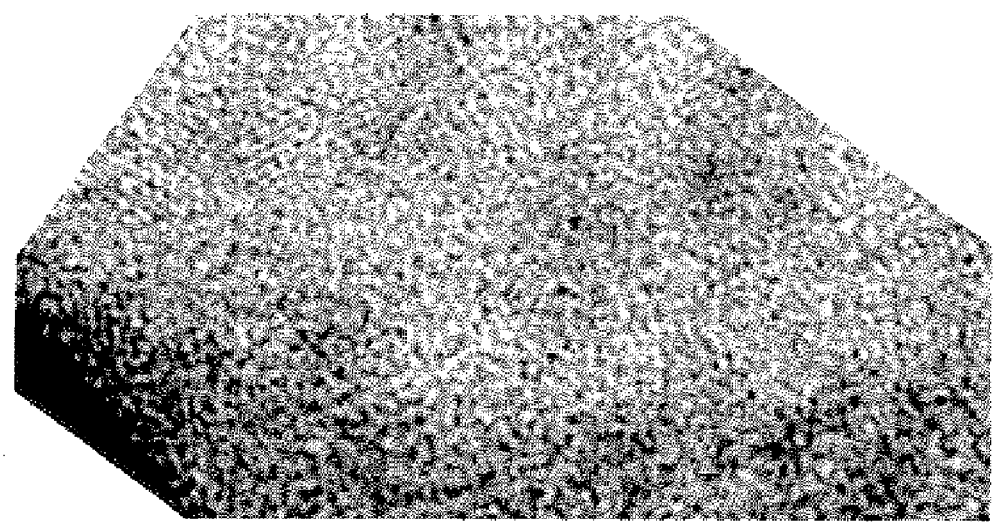
FIG. 13 is a photograph showing the variable resistance element embodiment according to the present invention taken by a super-high-resolution transmission electron microscope.
Figure 13B:
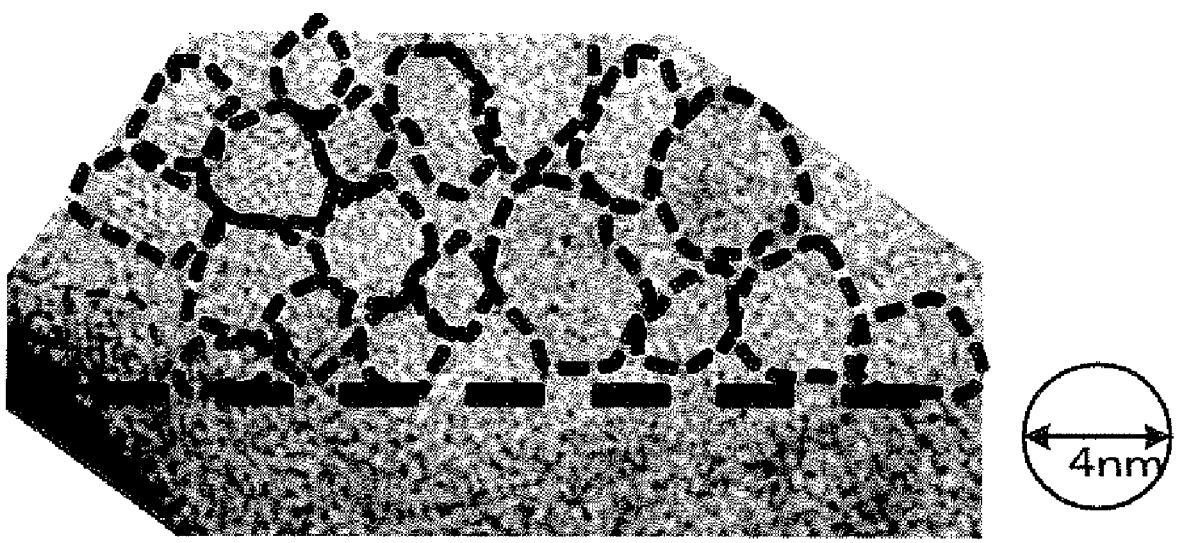
Figure 14:
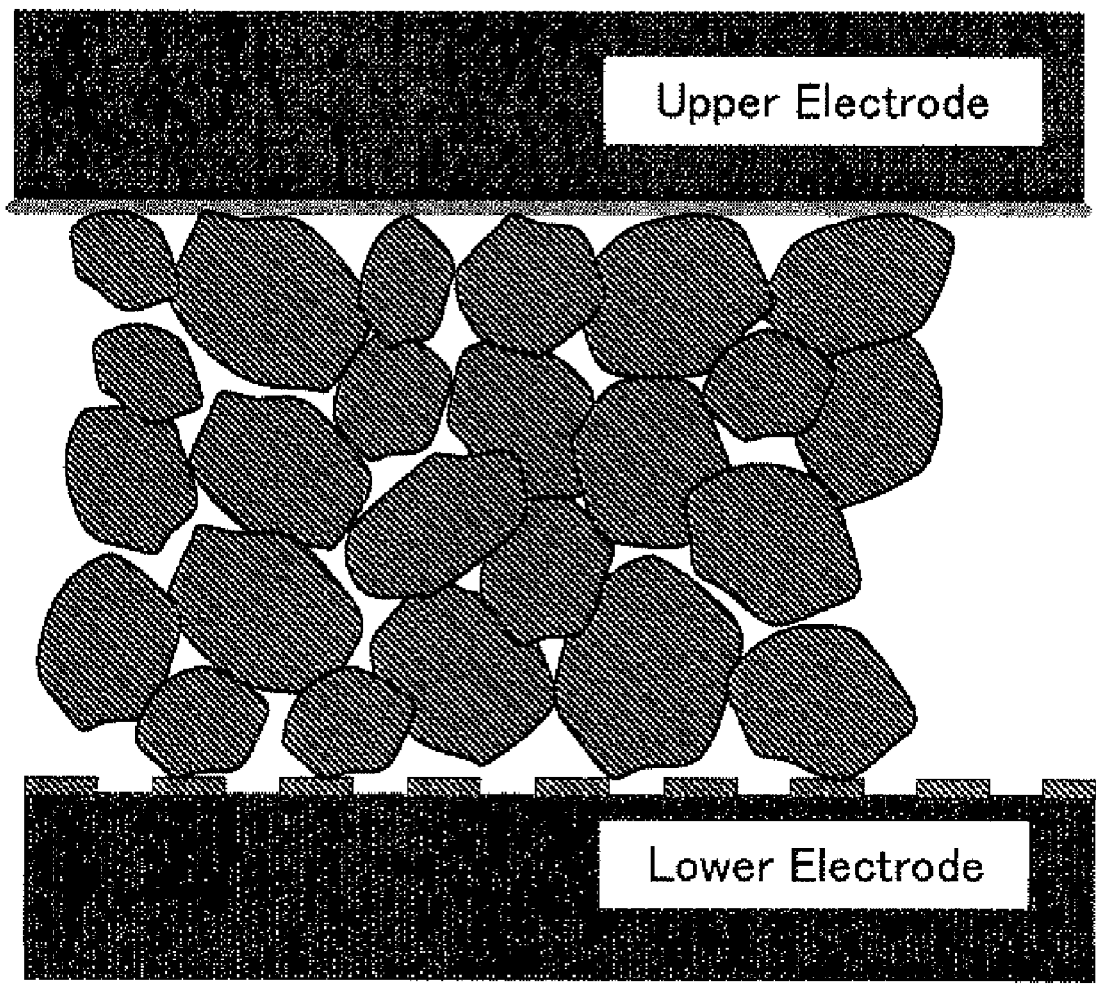
FIG. 14 is a schematic view showing the structure of the variable resistance element embodiment according to the present invention.

Next, the fact that the crystal state of the variable resistor is changed in response to the application of the voltage pulse will be described with reference to the drawing. FIG. 13 shows a sectional TEM photograph of the variable resistance element whose switching operation is performed at the ratio of 400 times taken by a TEM having a acceleration voltage of 800 keV. FIG. 13A is an actual photograph and FIG. 13B is a photograph in which crystal grains are highlighted to be easily distinguished. In addition, FIG. 14 is a conceptual view showing the structure of the variable resistance element in which the structure in FIG. 13B is schematically shown.

From the TEM photograph, it is confirmed that the titanium oxide layer sandwiched between the lower electrode and the upper electrode has many lattice images and comprises the crystal grains having a diameter of 2 to 4 nm.

Next, the fact that the crystal grain diameter of titanium oxide constituting the titanium oxide layer affects the resistance value will be described with reference to the drawing.

Figure 15:
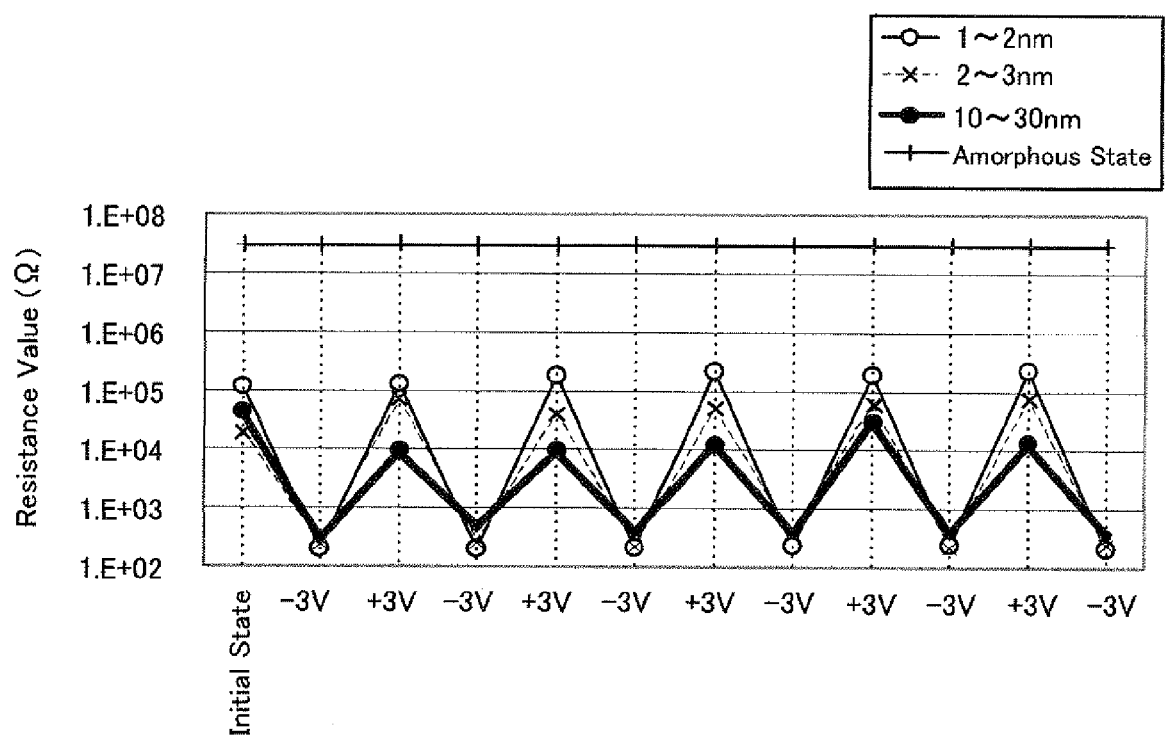
FIG. 15 is a graph showing switching characteristics when the crystal state of a variable resistor constituting the variable resistance element embodiment according to the present invention is changed.
Figure 16:
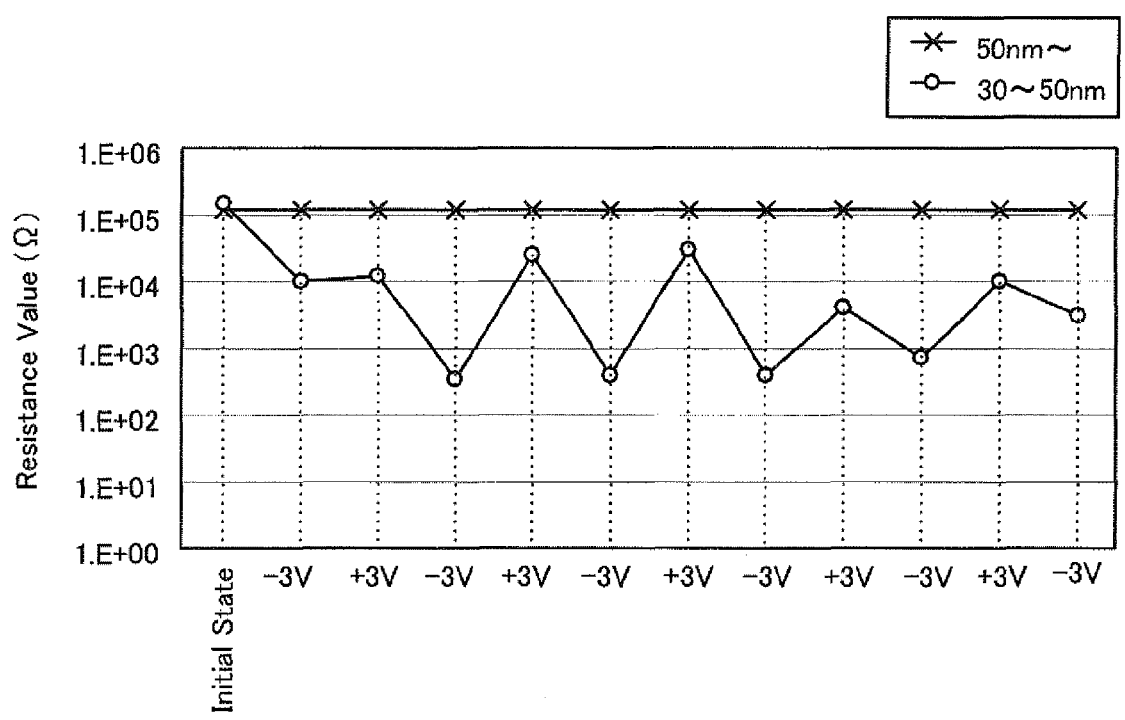
FIG. 16 is a graph showing switching characteristics when the crystal state of a variable resistor constituting the variable resistance element embodiment according to the present invention is changed.

FIGS. 15 and 16 show the switching characteristics of the variable resistance element when the crystal state of titanium oxide used as the variable resistor is changed. As measurement objects, anatase-type titanium oxide having crystal grain diameters of 1 to 3 nm, 3 to 10 nm, 10 to 30 nm, 30 to 50 nm, and 50 nm or more, and amorphous-type titanium oxide were used. Among the above objects, measurement results of the anatase-type titanium oxide having the crystal grain diameters of 1 to 3 nm, 3 to 10 nm and 10 to 30 nm and the amorphous-type titanium oxide are shown in FIG. 15, and measurement results of the anatase-type titanium oxide having crystal grain diameters of 30 to 50 nm and 50 nm or more are shown in FIG. 16. In addition, the element to be measured is provided by changing the crystal state of titanium oxide by changing a gas pressure and a substrate temperature at the time of film formation in the above step S2.

As shown in FIG. 15, it has been confirmed that the variable resistance element having the variable resistor formed of anatase-type titanium oxide having the crystal grain diameters 1 to 2 nm, 2 to 3 nm and 10 to 30 nm stably perform the switching operation. Especially, as the crystal grain diameter becomes small, the resistance ratio provided by the positive and negative pulse voltages is increased (in the case of the crystal grain diameter of 1 to 2 nm, the ratio is about 1000 times and in the case of the crystal grain diameter of 10 to 30 nm is about 400 times). Meanwhile, in the case of the amorphous-state titanium oxide, the resistance value at its initial state is high and there is no change in resistance value even when the positive pulse voltage and the negative pulse voltage are further applied.

Meanwhile, as shown in FIG. 16, it has been confirmed that the switching operation of the variable resistance element comprising the variable resistor formed of the anatase-type titanium oxide having the crystal grain diameter of 30 to 50 nm is instable. In addition, according to the variable resistance element comprising the variable resistor formed of the anatase-type titanium oxide having the crystal grain diameter 50 nm or more, even when the positive pulse voltage and the negative pulse voltage are alternately applied, it is confirmed that there is no change in the resistance value.

From the measurement results in FIGS. 15 and 16, according to the variable resistance element comprising the variable resistor 2 formed of the anatase-type titanium oxide having the crystal grain diameter of 30 nm or less, the switching operation can be performed stably by the positive and negative pulse voltages.

According to the present invention, since it is one of the objects to use the resistance value of the variable resistance element comprising the variable resistor whose resistance value is changed in response to the pulse voltage for storing information, it is important whether the resistance value of the variable resistance element determined by the application of the pulse voltage is stably maintained until the next pulse voltage application or not. Thus, this point will be examined with reference to the drawings hereinafter.

Figure 17:
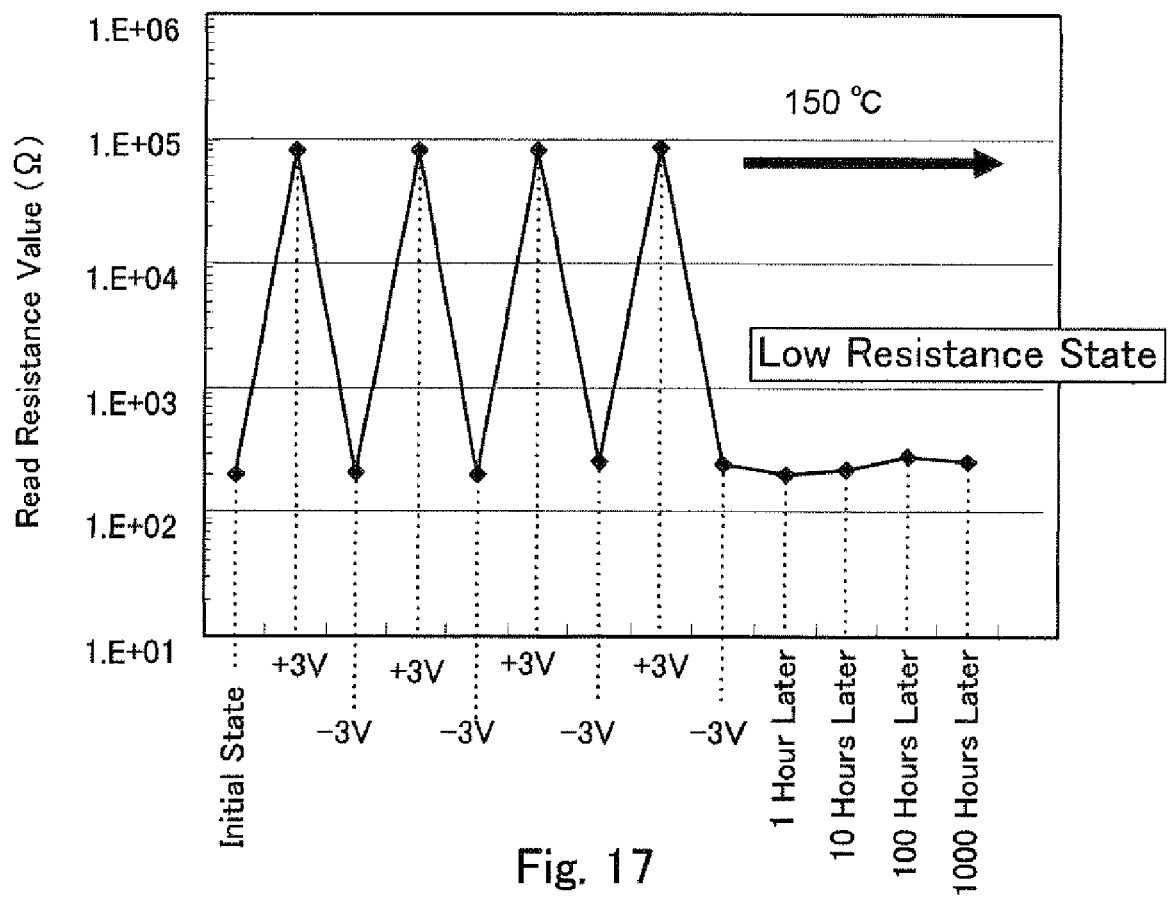
FIG. 17 is a graph showing retention characteristics of a low resistance state of the variable resistance element embodiment according to the present invention.
Figure 18:
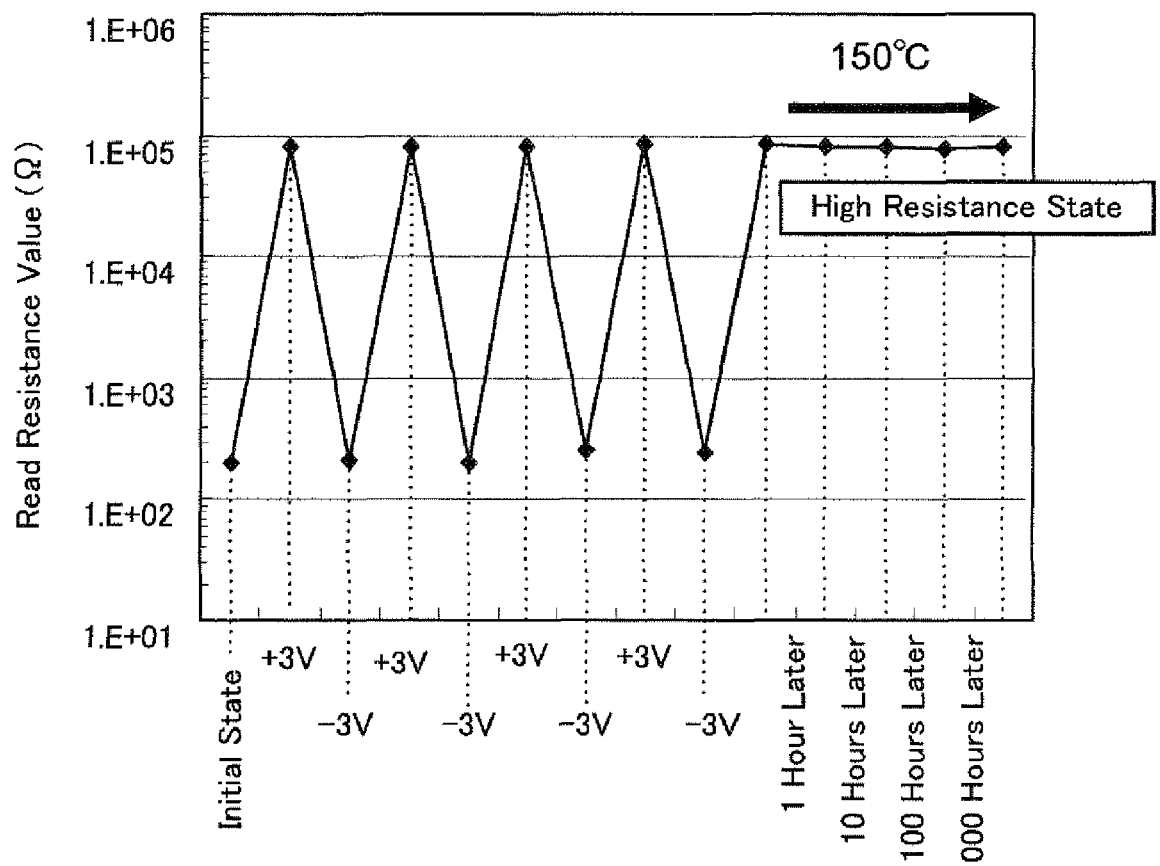
FIG. 18 is a graph showing retention characteristics of a high resistance state of the variable resistance element embodiment according to the present invention.

FIGS. 17 and 18 are graphs showing the resistance values of the variable resistance element at room temperature after the variable resistance element have been kept at a high temperature (150° C.) for 10 hours, 100 hours, and 1000 hours. FIG. 17 shows the case where the variable resistance element is kept in the low resistance state, and FIG. 18 shows the case where the variable resistance element is kept in the high resistance state. In addition, in either case, the measurement is performed by the same method as the measurement shown in FIG. 12 and the element formed of the anatase-type titanium oxide having the crystal grain diameter of 2 to 3 nm was used as the object to be measured similar to FIG. 12.

As shown in FIG. 17, according to the element of the present invention comprising the anatase-type titanium oxide having the crystal grain diameter of 2 to 3 nm, it has been confirmed that even after 1000 hours under the high-temperature state, the low resistance state can be maintained. In addition, as shown in FIG. 18, according to the element of the present invention comprising the anatase-type titanium oxide having the crystal grain diameter of 2 to 3 nm, it has been confirmed that even after 1000 hours under the high-temperature state, the high resistance state can be maintained.

Thus, according to the measurement results in FIGS. 17 and 18, it is confirmed that the element of the present invention can maintain the resistance value preferably under the high-temperature state. In other words, it is confirmed that the element of the present invention can write data repeatedly by the application of the voltage pulse and can be used as a nonvolatile memory device having favorable data retain characteristics under the high-temperature circumstance.

Next, the crystal structure of titanium oxide constituting the element of the present invention will be described with reference to the drawings.

FIG. 19 shows selected-area electron beam diffraction images of a fine crystal region of titanium oxide observed by a super-high-resolution transmission electron microscope. Similar to X-ray, since an electron beam satisfies the reflection condition of Bragg, a formula 1 is established where "$\lambda$" is a wavelength of an electron wave, "V" is an acceleration voltage, "−e" is the charge of an electron, and "$\theta$" is diffraction direction.

$$2d \sin \theta = \lambda n \text{ (n is an integer)} \quad \text{Formula 1}$$

Here, $\lambda$ is calculated by a formula 2 where "h" is a Planck constant, and "m>" is the mass of an electron.

$$\lambda = \frac{h}{\sqrt{2meV}}$$ Formula 2

According to the diffraction image formed when the electron beam and the like collides against a crystal, since the electron beam emitted in a diffraction direction at angle of 2θ with respect to an incident direction forms the profile of a circular cone having a semi-apex angle of 2θ with the incident direction as an axis, an interference spot is provided on a photographic dry plate as a concentric video image. The crystal structure at the observed region can be identified from the angle and the ring interval of the interference spot.

Figure 19A:
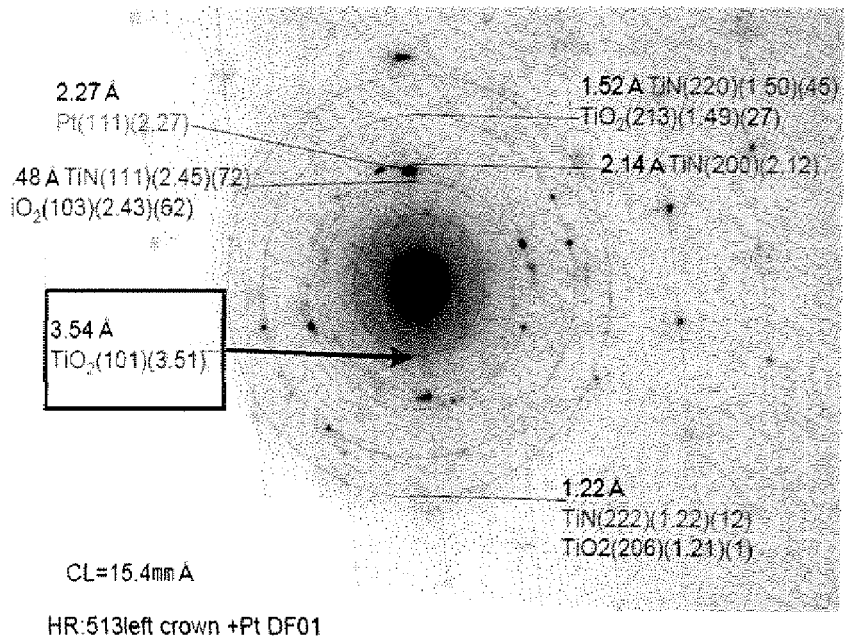
FIG. 19 is a selected area electron beam diffraction image of a fine crystal region of titanium oxide serving as one example of the variable resistor constituting the variable resistance element embodiment according to the present invention.
Figure 19B:
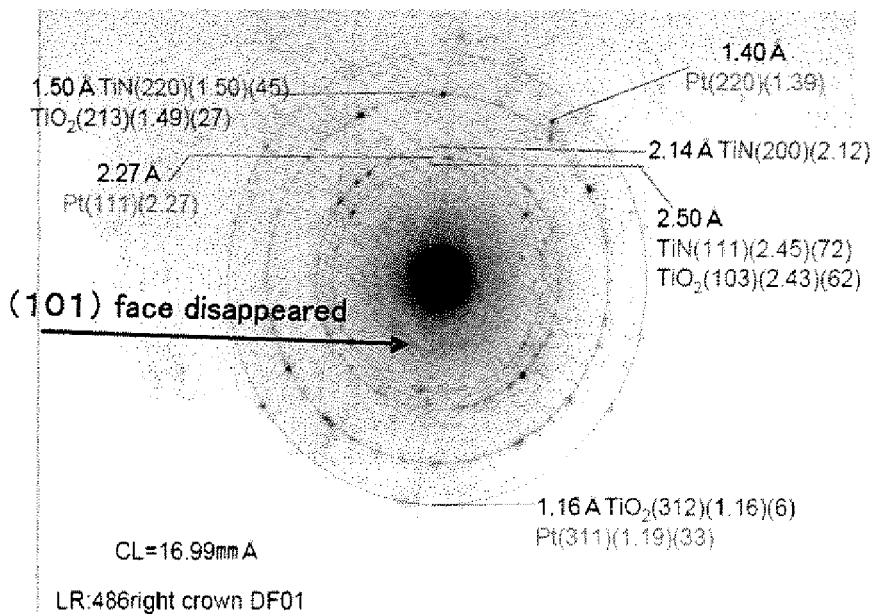

FIG. 19A shows the diffraction image in the high resistance state, and FIG. 19B shows the diffraction image in the low resistance state. While a diffraction ring of 3.54 Å can be identified in the diffraction image shown in FIG. 19A, the diffraction ring of 3.54 Å cannot be identified in the diffraction image shown in FIG. 19B. Furthermore, after analyzing the lattice image of the fine crystal of titanium oxide by the TEM provided by the observation and two-dimensional Fourier transformation corresponding to the lattice image, it is confirmed that the diffraction ring of 3.54 Å is derived from the anatase-type (101) face based on a face interval of the diffraction spot and an appearance pattern of the diffraction spot.

More specifically, while many (101) faces exist in the crystal of the anatase-type titanium oxide programmed in the high resistance state, the number of the (101) faces is reduced in the crystal of the anatase-type titanium oxide in the low resistance state. Since the (101) face is low in atomic packing factor and has a structure in which oxygen is out on the surface. In addition, it is reported that the (101) face is low in surface energy and in a very stable state. (refer to "Static simulation of bulk and selected surfaces of anatase $TiO_2$", Surface Science, 490 (2001), pp. 116-124 by A. Beltran et al.).

Thus, it is considered that oxygen on the (101) surface is easily absorbed and desorbed and a crystal can be easily formed. Since the formation of the crystal surface largely contributes to the switching phenomenon of the present invention, the lattice defect of oxygen and the like on the (101) face is generated due to the negative voltage pulse, and as a result, carrier conduction is generated. The positive voltage pulse complements the lattice defect of oxygen on the (101) face and the conduction is reduced.

After keen examination by the inventor of the present invention, it is found that while this phenomenon is generated in the anatase-type crystal having the crystal grain diameter of 30 nm or less, the resistance and the crystal structure are not changed in a rutile-type titanium oxide. Since the anatase type (density: 3.90 g/cm$^3$) is lower in density than the rutile type (density: 4.27 g/cm$^3$) and has a metastable crystal structure, it is easily affected by the application of the voltage pulse, and it is considered that as the crystal grain diameter becomes small, the (101) surface is changed more apparently.

In addition, although the lower electrode 3 is formed of TiN film and the upper electrode 1 is formed of Pt film in the above description, the present invention is not limited to the above materials, and they may be formed of Ir, Os, Ru, Rh, Pd, Ti, Co, W or an alloy of Ti and W. The same goes for the following embodiments. In addition, although the resistance value shows the high resistance in response to the application of the positive voltage pulse and the resistance value shows the low resistance in response to the application of the negative voltage pulse in the above description, the polarity can be changed by the combination of the upper and lower electrode materials. In addition, the applying time of the pulse is also changed by the combination of the electrode materials. This is considered because oxygen moved by the application of the voltage reaches the electrode material and the polarity, applying time and voltage is changed due to a difference in oxygen affinity of the electrode material.

In addition, in the case where the variable resistor 2 is formed of titanium oxynitride having the crystal grain diameter of 30 nm or less also, when the positive voltage (3V) having a pulse width of 200 nsec and the negative voltage (−3V) having a pulse width of 100 nsec are alternately applied, the same resistance ratio (rate of the resistance value of the high resistance state to the resistance value of the low resistance state) as the above has been confirmed. That is, the variable resistor 2 may be formed of titanium oxynitride other than titanium oxide.

SECOND EMBODIMENT

A description will be made of an element of the present invention and its manufacturing method according to a second embodiment (referred to as "this embodiment" occasionally hereinafter). According to this embodiment, a variable resistor 2 is formed of titanium oxynitride in which one part of oxygen of anatase-type titanium oxide is replaced with nitride, so that only step S2 for depositing a variable resistor film is different from the manufacturing method of the first embodiment shown in FIG. 10.

That is, similar to the first embodiment, a titanium nitride (TiN) film serving as a conductive material and having a thickness of 200 nm is deposited on a base substrate by the sputtering method to form a lower electrode 3 (step S1). Then, oxidation treatment is performed on the surface of the TiN film 3 under an atmosphere containing oxygen. The heat treatment is performed at 250° C. to 500° C. with an electric furnace or a lamp heating device. Thus, anatase-type titanium oxynitride having a crystal grain diameter of 30 nm or less is formed on the surface of the TiN film 3.

Then, steps S3 to S8 are performed by the same method as the above-described method in the first embodiment, whereby a variable resistance element is produced. According to the variable resistance element produced by the above method, since an variable resistor film is formed only by performing the oxidation treatment on the surface of the lower electrode 3 under the above condition in the step S2 for depositing the variable resistor film, the process is simplified.

THIRD EMBODIMENT

A third embodiment (referred to as "this embodiment" occasionally hereinafter) will be described with reference to FIGS. 20 to 22. This embodiment relates to the constitution of a semiconductor memory device comprising the element of the present invention described in the first or second embodiment.

Figure 20:
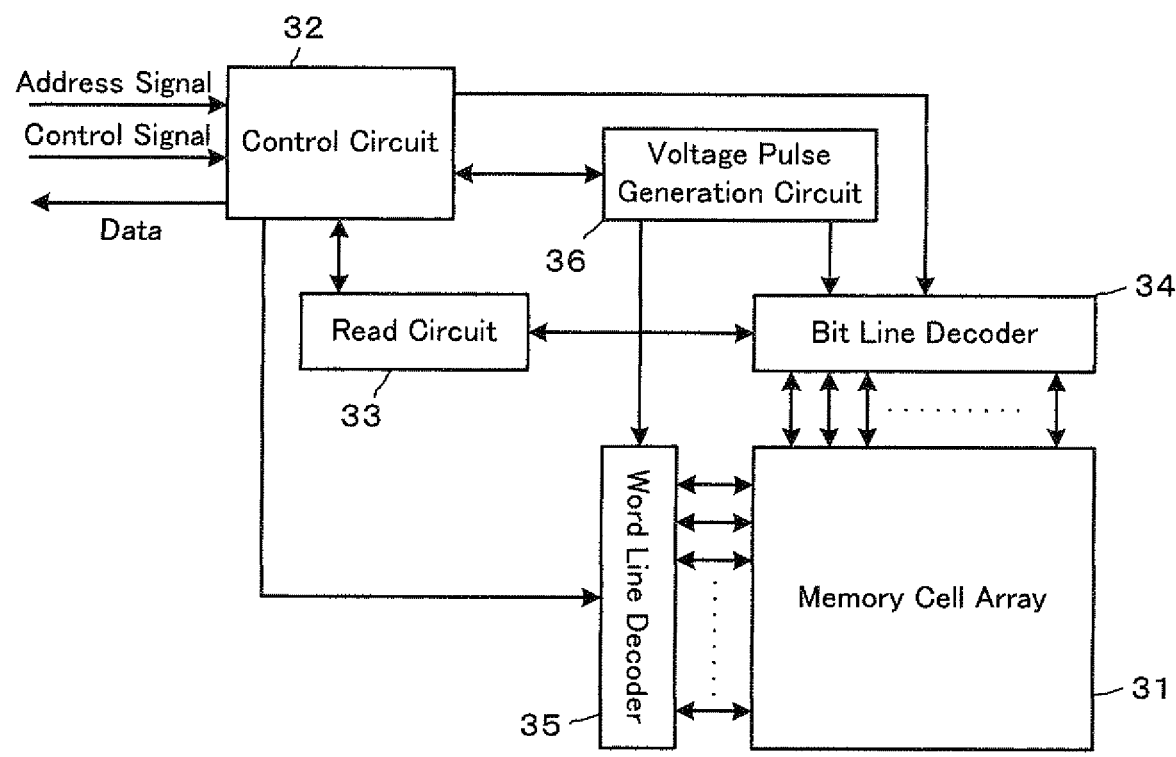
FIG. 20 is a schematic block diagram showing the constitution of a semiconductor memory device embodiment comprising the variable resistance element according to the present invention.

FIG. 20 is a schematic block diagram showing the constitution of a semiconductor memory device comprising the element of the present invention (referred to as "device of the present invention" occasionally hereinafter). A device 30 of the present invention shown in FIG. 20 comprises a memory cell array 31 comprising a plurality of arranged memory cells each having the element of the present invention and, as peripheral circuits of the memory cell array 31, a control circuit 32, a read circuit 33, a bit line decoder 34, a word line decoder 35, and voltage pulse generation circuit 36.

The word line decoder 35 is connected to each word line of the memory cell array 31 and selects the word line of the memory cell array 31 based on an address signal, and the bit line decoder 34 is connected to each bit line of the memory cell array 31 and selects the bit line of the memory cell array 31 based on the address signal.

The voltage pulse generation circuit 36 generates voltages to be applied to the bit line and the word line used in the reading action, the programming action and the erasing action of the memory cell array 31. At the time of programming action, the voltages of the bit line and the word line are set such that a voltage pulse having a voltage higher than the threshold voltage is applied only to between the upper electrode and the lower electrode of the variable resistance element of the memory cell selected by the address signal and the voltages are applied from the voltage pulse generation circuit 36 to the selected and unselected bit lines and the selected and unselected word lines through the bit line decoder 34 and the word line decoder 35.

The control circuit 32 controls the programming, erasing and reading actions of information to the memory cell constituting the memory cell array 31. When a programming command signal to program information at a specific address is applied to the control circuit 32, the control circuit 32 gives a command of voltage pulse generation to the voltage pulse generation circuit 36 and gives a command signal for selecting the memory cell corresponding to the address signal to the bit line decoder 34 and the word line decoder 35.

The bit line decoder 34 and the word line decoder 35 set the voltages to be applied to the bit lines and the word lines in such a manner that the pulse voltage outputted from the voltage pulse generation circuit 36 having a voltage higher than the threshold voltage is applied to only between the upper electrode and the lower electrode of the variable resistance element of the object memory cell. Thus, the voltage higher than the threshold voltage is applied to the selected memory cell, and the resistance value of the variable resistance element is changed and the information is programmed in the selected memory cell.

In addition, it is to be noted that in the programmed state, the resistance state of the variable resistance element is in the low resistance state hereinafter. At this time, when an erase command signal to erase information at the specific address is applied to the control circuit 32, similar to the method as that of the programming, the specific memory cell to be erased is selected and the pulse voltage having the predetermined voltage value is applied to the memory cell, and the resistance state of the variable resistance element of the memory cell is changed to the high resistance state, whereby the information is erased.

In addition, according to the reading action, a voltage is applied to the selected memory cell, and a current value of the memory cell is converted to a voltage value by the bit line decoder 34, and this voltage value is read by the read circuit 33, whereby information is read.

In addition, the control circuit 32 is provided with functions as a general address buffer circuit, data input/output buffer circuit, and a control input buffer circuit although they are not shown.

Figure 21:
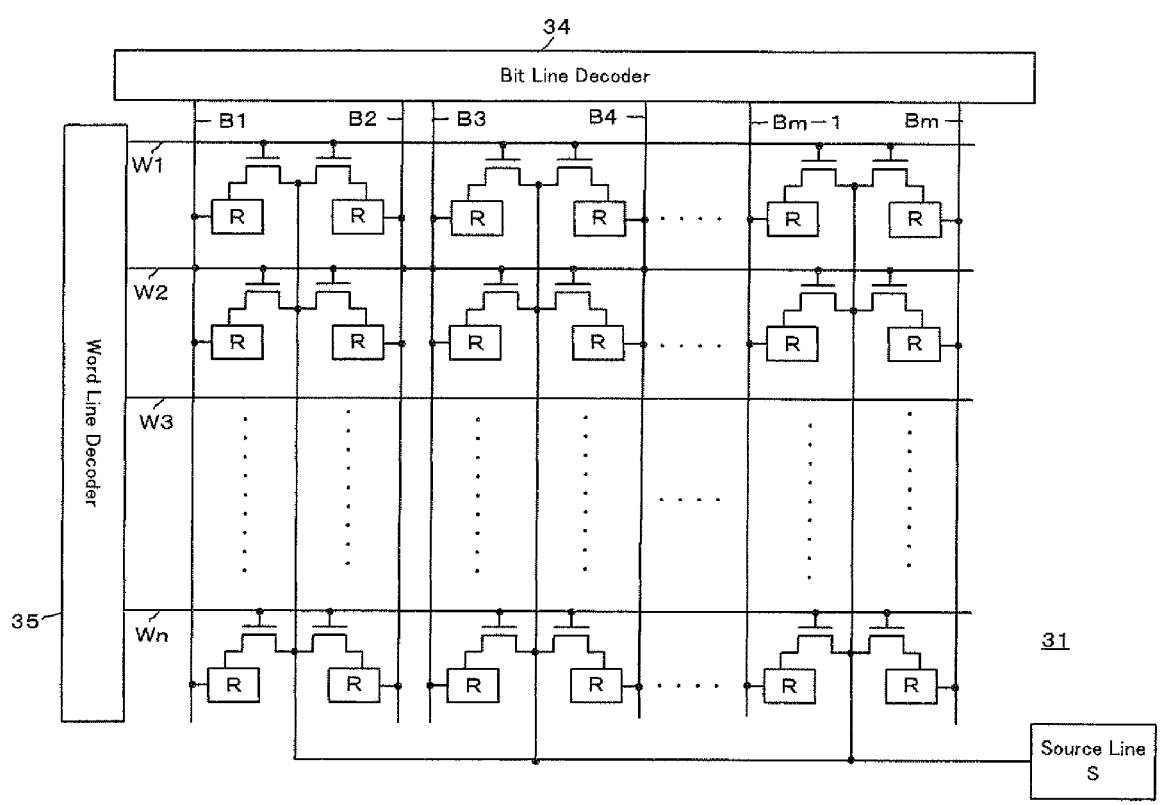
FIG. 21 is a circuit diagram showing one constitution example of a memory cell array in the semiconductor memory device embodiment according to the present invention.

FIG. 21 is a circuit diagram showing one constitution example of the memory cell array 31. The memory cell array 31 shown in FIG. 21 has a so-called 1T1R constitution in which one memory cell has one selection transistor and one variable resistance element R. Referring to FIG. 21, the gate of the selection transistor of each memory cell is connected to the word line (W1 to Wn) and each word line is connected to the word line decoder 35. In addition, the source of the selection transistor of each memory cell is connected to the source line S. In addition, one end (upper electrode side) of the variable resistance element R of each memory cell is connected to the bit line (B1 to Bm), and each bit line is connected to the bit line decoder 34. In addition, "n" and "m" are natural numbers.

The operation of the semiconductor memory device will be described with reference to FIGS. 20 and 21.

First, the programming action of the memory cell will be described. Here, as described above, the programmed state is defined such that the variable resistance element R is in the low resistance state. The word line Wx (x is a natural number) connected to the selected cell is set at +2V according to the address signal of the word line decoder 35, and the word line Wy (y is a natural number) connected to the unselected cell is set at 0V according to the address signal of the word line decoder 35. Thus, the source line is set at 0V and the bit line Bx connected to the selected cell is set at +2V according to the address signal of the bit line decoder 34, and the bit line By connected to the unselected cell is set at 0V according to the address signal of the bit line decoder 34. Thus, since the positive voltage is applied to the upper electrode of the variable resistance element R of the selected cell, data is programmed to the low resistance state. Meanwhile, since the voltage is not applied to the variable resistor of the variable resistance element R of the unselected cell, data is not programmed (data is not changed).

Here, although the voltage applied to the word line Wx is set at +2V in the above description, this value may only have to be not less than a voltage that turns on the selection transistor (the threshold voltage of the transistor). Similarly, although the voltage applied to the bit line Bx is set at +2V in the above description, the present invention is not limited to this value and when the source line is at the ground voltage, it only has to be not less than the voltage that switches the variable resistance element (threshold voltage of the switching operation).

Next, the reading action of the memory cell will be described. The word line Wx connected to the selected cell is set at +2V according to the address signal of the word line decoder 35, and the word line Wy connected to the unselected cell is set at 0V according to the address signal of the word line decoder 35. Thus, the source line is set at 0V, and the bit line By connected to the unselected cell is set at 0V according to the address signal, and the bit line Bx connected to the selected cell is set at read voltage +1V according to the address signal of the bit line decoder 34. This read voltage is not limited to +1V and it may be less than the voltage that switches the variable resistance element R (threshold voltage of the switching operation), to prevent the variable resistance element R of the unselected sell from being switched and prevent the data from being changed. For example, the read voltage may be set at +0.7V that is a voltage value applied to the variable resistance element to be measured by the parameter analyzer 23 when the I-v characteristics of the variable resistance element is measured on the condition that the resistance value is not changed in the first embodiment.

When the read voltage is applied, the memory cell current flowing in the selected memory cell is converted to a voltage value by the bit line decoder 34, and this voltage value is outputted to the read circuit 33 and determined in the read circuit 33, and its result is transferred to the control circuit 32 and outputted from the control circuit 32 to the outside, whereby the reading action is performed. When the resistance state of the variable resistance element of the selected memory cell is high, the memory cell current is small and when the resistance state is low, the memory cell current is large, so that data can be read by converting this current difference to the voltage value.

Next, the erasing action of the memory cell will be described. Here, as described above, the erased state is defined that the variable resistance element R is in the high resistance state. The word line Wx connected to the selected cell is set at +2V according to the address signal of the word line decoder 35, and the word line Wy connected to the unselected cell is set at 0V according to the address signal of the word line decoder 35. Thus, the source line is set at +2V and the bit line Bx connected to the selected cell is set at 0V according to the address signal of the bit line decoder 34, and the bit line By connected to the unselected cell is set at +2V according to the address signal of the bit line decoder 34. Thus, since the negative voltage is applied to the upper electrode of the variable resistance element R of the selected cell, data is erased to the high resistance state (data is written to the high resistance state). Meanwhile, since the voltage is not applied to the variable resistor of the variable resistance element R of the unselected cell, data is not erased (data is not changed).

Here, similar to the programming action, although the voltage applied to the word line Wx is set at +2V in the above description, this value is not limited to the above value as long as it is not less than the threshold voltage of the transistor, and similarly, although the voltage applied to the bit line Bx is set at +2V in the above description, when the source line is at the ground voltage, this value is not limited to the above value as long as it is not less than the threshold voltage of the switching operation.

Figure 22:
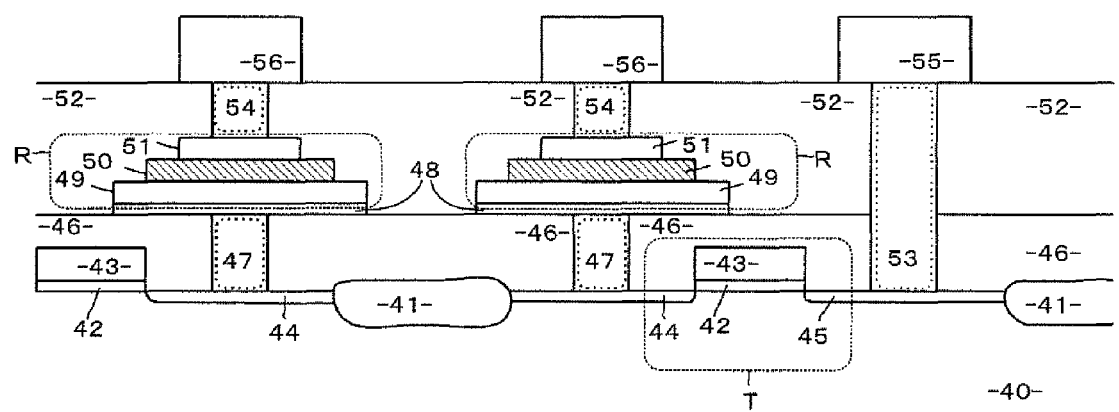
FIG. 22 is a schematic sectional view showing one example of a memory cell forming the memory cell array in the semiconductor memory device according to the present invention.

As one example of the memory cell constituting the above-described device of the present invention, a memory cell having the 1T1R constitution as shown in a schematic sectional view in FIG. 22 can be used. The device of the present invention having the above memory cell is manufactured by the following manufacturing process.

First, a selection transistor T is formed on a semiconductor substrate 40. That is, the selection transistor T having a gate insulation film 42, a gate electrode 43, a drain diffusion layer area 44 and a source diffusion layer area 45 is formed on the semiconductor substrate 40 having an element isolation area 41. At this time, peripheral circuits (the control circuit 32 the read circuit 33, the bit line decoder 34, the word line decoder 35, and the voltage pulse generation circuit 36 and the like) other than the memory cell are also formed although they are not shown.

Then, an interlayer insulation film 46 is formed of BPSG (Boron Phosphorous Silicate Glass), and a contact hole 47 reaching the drain area 44 of the selection transistor T is formed by the well-known photolithography method and dry etching method. Thus, a contact plug is formed by embedding conductive polysilicon only in the contact hole 47.

Then, an ohmic contact layer 48 is formed by depositing a Nm film having a thickness of 100 nm/50 nm by the sputtering method, to stably ensure the electric connection between the conductive contact plug embedded in the contact hole 47 and a lower electrode 49 constituting the variable resistance element R. Then, the lower electrode 49 is formed by depositing a TiN film having a thickness of 200 nm on the ohmic contact layer 48.

Then, a variable resistor film 50 is formed by depositing a titanium oxide film having a thickness of 5 to 50 nm on the lower electrode (TiN film) 49 by the DC magnetron sputtering method. Then, an upper electrode 51 is formed by depositing a Pt film having a thickness of 10 nm. Then, the upper electrode 51, the variable resistor film 50, and the lower electrode 49 are sequentially processed by the well-known photolithography and dry etching, whereby the variable resistance element R is completed. Since the detailed manufacturing method of the variable resistance element R has been described in the first embodiment, it will be omitted here.

After the variable resistance element R has been formed as described above, an interlayer insulation film 52 having a thickness of 50 to 60 nm is formed on the variable resistance element R, and a contact hole 54 connected to the variable resistance element R and a contact hole 53 connected to the source diffusion layer area 45 of the selection transistor T are formed.

Next, a wiring 55 and a wiring 56 are formed by depositing a film of TiN/Al—Si/TiN/Ti as wiring materials and processing the film by the well-known photolithography and dry etching.

Then, an interlayer insulation film 57 is formed, a contact hole (not shown) reaching the wiring 55 or the wiring 56 is formed, and a wiring 58 is formed by depositing a TiN/Al—Si/TiN/Ti film and processing the film by the well-known photolithography method and dry etching (processing pattern is not shown). Finally, an SiN film is formed as a surface protection film 59 by the plasma CVD method, whereby the semiconductor memory device comprising the variable resistance element R and the selection transistor T in the memory cell is completed.

In addition, although contact hole formation and wiring processing of the peripheral circuit are omitted in the above manufacturing process, they are to be formed at the same time of the formation of the components in the memory cell.

In addition, although the variable resistor 50 is formed by the DC magnetron sputtering method in this embodiment, it may be formed by the CVD method as described in the first embodiment.

Although the above description has been made of the driving method of the variable resistance element and the memory device having the variable resistance element as the memory cell, showing specific numeric values, since it has been confirmed that the specific numeric value varies depending on the material, the composition and the structure of the variable resistance element, so that the manufacturing method according to the present invention and the device according to the present invention are not limited to the exemplified numeric value in the above embodiments. In addition, although the functional constitution and the sectional structure of the device according to the present invention have been specifically described, the constitution and the structure are only one example, so that they can be optionally changed based on the scope of the present invention.

For example, although the memory cell has the 1T1R constitution comprising the variable resistance element R and the selection transistor in the third embodiment, the present invention is not limited to this. The memory cell may have a constitution in which the bit line and the word line are directly connected to the upper electrode or the lower electrode, respectively, and data of a variable resistor disposed at an intersection point (cross point) between both electrodes is directly read, that is, a cross-point constitution. In this case, the constitution shown in FIG. 20 showing the case where the data is read through the bit line decoder 34 may be changed to the constitution in which the data is read through the word line decoder 35.

In addition, in order to reduce a parasitic current in the cross-point constitution, a memory cell may have a 1D1R constitution in which the variable resistance element R and a diode are connected in series. Although the diode is connected to the variable resistor in series outside the upper electrode or the lower electrode in general, the diode may be disposed between the variable resistor and the upper electrode or between the variable resistor and the lower electrode. The diode may be formed of a material showing PN diode characteristics or Schottky diode characteristics or varistor such as ZnO and $Bi_2O_3$.

In addition, although the voltage pulse for the programming, erasing and reading actions are generated from one circuit block in the voltage pulse generation circuit shown in FIG. 20, a voltage pulse generation circuit may be provided to generate a voltage pulse with respect to each operation. Furthermore, the voltage pulse generation circuit to generate the voltage pulse for the reading action may be provided in the bit line decoder 34 and the word line decoder 35.

In addition, according to the element of the present invention, although the variable resistor is sandwiched between the upper electrode and the lower electrode, the variable resistor is not necessarily in contact with both electrodes as long as it can be electrically connected to them. In this case, an area of the region in which either one of the electrodes and the variable resistor are opposed may be regarded as an electrode area.

Furthermore, although titanium nitride is designated by TiN in the description of each embodiment, this is only an abbreviation and its relative proportion is not limited.

In addition, although the description has been made of the anatase-type titanium oxide in the third embodiment, the material is not limited to titanium oxide but may be anatase-type titanium oxynitride in which a part of oxygen is replaced with nitrogen.

The present invention can be applied to the semiconductor memory device comprising the variable resistance element whose electric resistance is changed when a voltage pulse is applied to both ends thereof.

The invention claimed is:

1. A variable resistance element comprising:
a first electrode;
a second electrode; and
a variable resistor sandwiched between the first electrode and the second electrode, wherein
an electric resistance between the first electrode and the second electrode is changed by applying a voltage pulse between the first electrode and the second electrode, and
the variable resistor is formed of titanium oxide or titanium oxynitride having a crystal grain diameter of 30 nm or less.

2. The variable resistance element according to claim 1, wherein a crystal structure of the variable resistor is anatase type.

3. The variable resistance element according to claim 1, wherein a 101 face of a crystal of the variable resistor is changed by applying a voltage pulse between the first electrode and the second electrode.

4. The variable resistance element according to claim 3, wherein a resistance value of the variable resistor is increased when the 101 face increases, and the resistance value of the variable resistor is decreased when the 101 face decreases or disappears.

5. The variable resistance element according to claim 1, wherein at least one of the first electrode and the second electrode contains an element selected from Pt, Ir, Os, Ru, Rh, Pd, Ti, Co, W, and an alloy of Ti and W, or contains titanium nitride.

6. A manufacturing method of a variable resistance element, which is the variable resistance element according to claim 1, the manufacturing method comprising:

a first step for forming the second electrode;
a second step for forming the variable resistor by depositing a titanium oxide film or a titanium oxynitride film having a crystal grain diameter of 30 nm or less on an upper surface of the second electrode; and
a third step for forming the first electrode on an upper surface of the variable resistor.

7. The manufacturing method according to claim 6, wherein the second step comprises a step of forming the titanium oxide film under a substrate temperature of 150° C. to 500° C.

8. The manufacturing method according to claim 6, wherein the second step comprises a step of performing a heat treatment on the titanium oxide film at 250° C. to 500° C. under an oxygen atmosphere or an atmosphere containing oxygen after the titanium oxide film is deposited.

9. The manufacturing method according to claim 6, wherein
the first step comprises a step of forming a titanium nitride as the second electrode, and
the second step comprises a step of forming the titanium oxide film or the titanium oxynitride film on a surface of the second electrode by performing a heat treatment on the surface of the second electrode at 250° C. to 500° C. under an oxygen atmosphere or an atmosphere containing oxygen.

10. A semiconductor memory device, comprising:
a memory cell array in which a plurality of memory cells each having the variable resistance element according to claim 1 are arranged;
a selecting means for selecting a specific target memory cell from the plurality of memory cells constituting the memory cell array; and
a pulse voltage generating means for generating a pulse voltage, wherein information is written by a change of a resistance value of the variable resistance element when the pulse voltage generated from the pulse voltage generating means is applied to the variable resistance element of the target memory cell selected by the selecting means.

11. The semiconductor memory device according to claim 10, wherein at least one of the first electrode and the second electrode of the variable resistance element contains an element selected from Pt, Ir, Os, Ru, Rh, Pd, Ti, Co, W, and an alloy of Ti and W, or contains titanium nitride.

12. The variable resistance element according to claim 1, wherein the variable resistor is arranged to be in crystalline state in both low and high electric resistances.

13. The manufacturing method according to claim 6, wherein the second step comprises forming the variable resistor adapted to be in crystalline state in both low and high electric resistances.

14. A variable resistance element, comprising:
a lower electrode;
an upper electrode; and
a variable resistor sandwiched in between and in electrical contact with the lower and upper electrodes, the variable resistor being formed of anastase type titanium oxide or titanium oxynitride having a crystal grain diameter of 30 nm or less,
wherein grain diameter of a crystal is an average value of a long side and a short side of a circumscribed rectangular solid of the crystal.

15. The variable resistor element according to claim 14, wherein the variable resistor is arranged to change electrical resistance upon application of a voltage pulse applied to the lower and upper electrodes.

16. The variable resistance element according to claim 14, wherein the variable resistor is arranged to be remain a crystal in both low and high electrical resistance states.

17. The variable resistance element according to claim 14, wherein the lower electrode is formed of TiN and the variable resistor is anastase type titanium oxynitride with the crystal grain diameter of 30 nm or less being formed on a surface of the lower electrode.

* * * * *